(12) United States Patent
Oyama

(10) Patent No.: US 7,161,848 B2
(45) Date of Patent: Jan. 9, 2007

(54) DATA WRITE CIRCUIT AND DATA WRITE METHOD FOR SEMICONDUCTOR STORAGE DEVICE

(75) Inventor: Kazuhiko Oyama, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 8 days.

(21) Appl. No.: 11/134,435

(22) Filed: May 23, 2005

(65) Prior Publication Data

US 2006/0044869 A1    Mar. 2, 2006

(30) Foreign Application Priority Data

Aug. 27, 2004   (JP)   ............... 2004-247953

(51) Int. Cl.
*G11C 7/10* (2006.01)
(52) U.S. Cl. ............... 365/189.05; 365/185.03; 365/189.04
(58) Field of Classification Search ........... 365/189.05, 365/185.03, 189.04, 189.09, 185.14
See application file for complete search history.

(56) References Cited

U.S. PATENT DOCUMENTS 5,757,700 A * 5/1998 Kobayashi ............ 365/189.01
6,243,297 B1   6/2001 Nagatomo
7,006,397 B1 * 2/2006 Toda ..................... 365/205

FOREIGN PATENT DOCUMENTS

JP    2000-331486    11/2000

* cited by examiner

*Primary Examiner*—Anh Phung
*Assistant Examiner*—Dang Nguyen
(74) *Attorney, Agent, or Firm*—Nixon Peabody LLP; Donald R. Studebaker

(57) ABSTRACT

A data write circuit of a semiconductor storage device is provided in which a multi-bit write method can be employed even if data input takes a long time. The data write circuit includes a multi-bit decoder and data latch circuit for sequentially latching a plurality of data to be respectively written to a plurality of memory cells of multi-bits and are sequentially input in accordance with a change of an input multi-bit address, a column decoder for respectively applying latched data to sources of the memory cells based on a column address among the input address, and a cell drain voltage generator for simultaneously applying high cell drain voltage (approx. 5.0 volts) for writing data to the drains of the memory cells when all of the data are latched and are applied to the sources of the memory cells so as to respectively write the data to the memory cells.

16 Claims, 12 Drawing Sheets

PRIOR ART

DATA WRITE CIRCUIT AND DATA WRITE METHOD FOR SEMICONDUCTOR STORAGE DEVICE

BACKGROUND OF THE INVENTION

1. Field of the Invention

The present invention relates to a data write circuit and data write method for a semiconductor storage device such as EEPROM.

2. Description of the Related Art

A conventional EEPROM has employed a single bit write method in which each write operation (holding of a single write operation) performs data writing to one memory cell (single bit). However, recent increase in memory capacities arouses concern about an increase of the time period for such data writing. In order to avoid this concern, a multi-bit write method is employed in which each write operation (holding of a single write operation) performs data writing to a plurality of memory cells (multi-bits).

FIG. 7 shows a block diagram of a conventional EEPROM. The conventional EEPROM in FIG. 7 includes a memory cell array having a plurality of memory cells arranged in a matrix pattern, a conventional data write circuit for data writing to the memory cells in the memory cell array, an input pad 1 for receiving data DQ to be written to the memory cells, three input pads 2 for respectively receiving 3 configuration bits MA0, MA1 and MA2 as a multi-bit addresses MBA, an input pad 3 for receiving the address ADD formed by a column address and a row address, an input pad 15 for receiving a write voltage VPP, an input pad 16 for receiving a control signal CEB, and an input pad 17 for receiving a control signal OEB.

Referring to FIG. 7, the conventional data write circuit mentioned above further includes eight multi-bit decoder & data latch circuits 4 (4-A0, 4-A1, . . . 4-A7) for decoding the multi-bit address MBA and latching the input data DQ, eight column decoders 5 (5-A0, 5-A1, . . . 5-A7) for decoding the column address, a row decoder 6 for decoding the row address, and a cell drain voltage generator 7. Accordingly, multi-bit writing can be achieved to the memory cells consisting of eight multi-bits A0, A1, . . . A7. The multi bit decoder & data latch circuit 4-Ak and column decoder 5-Ak are in charge of the multi-bit Ak, where k denotes an arbitrary integer from 0 to 7.

FIG. 8 shows an example of a logic circuit diagram in the cell drain generator 7 of the conventional data write circuit of FIG. 7. This conventional cell drain voltage generator 7 includes a high voltage detection circuit 30 for outputting a write voltage detection signal VPPH which becomes L level when the write voltage VPP to be input is at low voltage level (e.g. GND level (0 volt)), and becomes H level when the write voltage VPP is at high voltage level (e.g. 8 volts). The circuit of the cell drain voltage generator 7 outputs a cell drain voltage CDV of either 0.6 volts or 5.0 volts depending on the logic of the write voltage detection signal VPPH and the control signals CEB and OEB.

FIG. 9 shows a timing chart of conventional multi-bit writing for the EEPROM of FIG. 7. Before time t1, the row decoder 6 sets all of M word lines WL1 to WLM and two select lines SLodd and SLeven to GND level (0 volt). All the multi-bit decoder & data latch circuits 4-A0 to 4-A7 latch H level as the initial data, and latch inputs of these multi-bit decoder & data latch circuits 4-A0 to 4-A7 are all disconnected from the input pad 1.

Then at time t1, the multi-bit address MBA for selecting the multi-bit A0 is input from the input pad 2. Further, in the case of an example of FIG. 9, the address ADD for selecting a decode address a0 of the word line WLm, odd select line SLodd and the bit lines BLn-A0 to BLn-A7 is input from the input pad 3.

Moreover, at time t1, the write voltage detection signal VPPH (write voltage VPP) and the control signals CEB and OEB are VPPH (VPP)/CEB/OEB=H level (high voltage level (approx. 8.0 volts)/H level/H level, and in the cell drain voltage generator 7 (see FIG. 8), the output of the NAND gate 33 is H level and the output of the NAND gate 34 is L level, and thus the PMOS transistor 31 is OFF and the PMOS transistor 32 is ON so that a cell drain voltage CDV of approx. 0.6 volts is output from the cell drain voltage generator 7.

When the row address among the address ADD for selecting the decode address a0 is input, the row decoder 6 selects the word line WLm from M word lines WL1 to WLM, and selects the odd select line SLodd from two select lines SLodd and SLeven, and applies approx. 8.0 volts from the write voltage VPP to the word line WLm and the odd select line SLodd. Upon this voltage application, all the odd selectors (including odd selectors 8-odd1 and 8-odd2) turn ON so that the cell drain voltage CDV (approx. 0.6 V in this case) is supplied to all the drain lines (including drain lines DLodd1 and DLodd2) connected to these odd selectors.

When the column address among the address ADD for selecting the decode address a0 is input, the column decoder 5-Ak in charge of the multi-bit Ak selects the bit line BLn-Ak, and connects the output of the multi-bit decoder & data latch circuit 4-Ak in charge of the multi-bit Ak to this bit line BLn-Ak.

When the multi-bit address MBA for selecting the multi-bit A0 is input, the multi-bit decoder & data latch circuit 4-A0 in charge of the multi-bit A0 connects the latch input to the input pad 1.

Then at time t2, the control signal CEB to be input to the cell drain voltage generator 7 from the input pad 16 changes from H level to L level, and the write disabled period changes to the write operation period.

As described above, when the logic changes from VPPH (VPP)/CEB/OEB=H level (high voltage level)/H level/H level to VPPH (VPP)/CEB/OEB=H level (high voltage level)/L level/H level and the write disabled period changes to the write operation period, the output of the NAND gate 33 in the cell drain voltage generator 7 (see FIG. 8) changes from H level to L level and the output of the NAND gate 34 changes from L level to H level, and thus the PMOS transistor 31 turns ON and the PMOS transistor 32 turns OFF so that the cell drain voltage CDV to be output from the cell drain voltage generator 7 rises from approx. 0.6 volts to approx. 5.0 volts.

This cell drain voltage CDV with a high voltage level (approx. 5.0 volts) is supplied to the drains of half the memory cells out of all the memory cells of the memory cell unit via all the odd selectors (including odd selectors 8-odd1 and 8-odd2) and all the drain lines (including drain lines DLodd1 and DLodd2).

In the case of a memory cell where approx. 8.0 volts is applied to the control gate from the word line WLm and the source is connected to the latch output of the multi-bit decoder & data latch circuit 4-Ak via the bit line BLn-Ak and column decoder 5-Ak, rise of the cell drain voltage CVD applied to the drain to approx. 5.0 volts causes an electron injection into the floating gate if the latch data of the multi-bit decoder & data latch circuit 4-Ak is at L level and the voltage to be applied from the bit line BLn-Ak to the source is GND level (0 volt). On the other hand, the rise of the cell drain voltage CVD to approx. 5.0 volts causes no electron injection into the floating gate if the latch data of the multi-bit decoder & data latch circuit 4-Ak is at H level and the voltage to be applied from the bit line BLn-Ak to the source is close to the power supply voltage VCC (approx. 3.5 volts).

In other words, if the cell drain voltage CDV rises to approx. 5.0 volts, the input data DQ-Ak that is latched by the multi-bit decoder & data latch circuit 4-Ak can be written to the memory cell of the multi-bits Ak selected by the word line WLm and the bit line BLn-Ak.

During this data write period, the multi-bit addresses MBA to select the multi-bits A0 to A7 are sequentially input from the input pad 2, and eight data of DQ-A0 to DQ-A7 to be respectively written to the eight multi-bits A0 to A7 are sequentially input from the input pad 1. Then, these input data DQ-A0 to DQ-A7 are latched by the multi-bit decoder & data latch circuits 4-A0 to 4-A7 in charge of the multi-bits A0 to A7, respectively. Accordingly, these input data DQ-A0 to DQ-A7 are written to the memory cells of the multi-bits A0 to A7, respectively.

When the data DQ-A0, which is either at H level or L level, to be written to the memory cell 9 of the multi-bit A0 is input from the input pad 1, the multi-bit decoder & data latch circuit 4-A0 in charge of the multi-bit A0, which is being selected at this time, latches the input data DQ-A0 instead of the initial data (H level). The input data DQ-A0 latched by the multi-bit decoder & data latch circuit 4-A0 is output to the bit line BLn-A0 via the column decoder 5-A0, and is written to the memory cell 9 of the multi-bit A0.

If the data DQ-A0 is L level, the source of the memory cell 9 becomes GND level (0 volt), and thus electrons are injected into the floating gate of the memory cell 9, whereas if the data DQ-A0 is H level, the source of the memory cell 9 becomes close to the power supply voltage VCC (approx. 3.5 volts), and thus no electron is injected into the floating gate of the memory cell 9.

Then at time t3, when the multi-bit address MBA to be input from the input pad 2 is changed from a value for selecting the multi-bit A0 to a value for selecting the multi-bit A1, the multi-bit decoder & data latch circuit 4-A0 in charge of the multi-bit A0 disconnects the latch input from the input pad 1, and the multi-bit decoder & data latch circuit 4-A1 in charge of the multi-bit A1 connects the latch input to the input pad 1.

Then, when the data DQ-A1 to be written to the memory cell 10 of the multi-bi A1 is input from the input pad 1, the multi-bit decoder & data latch circuit 4-A1 in charge of the multi-bit A1, which is being selected at this time, latches the input data DQ-A1 instead of the initial data (H level). This input data DQ-A1 latched by the multi-bit decoder & data latch circuit 4-A1 is output to the bit line BLn-A1 via the column decoder 5-A1, and is written to the memory cell 10 of the multi-bit A1.

In the same way, the multi-bit addresses MBA to be input from the input pad 2 at times t4, t5, t6, t7, t8 and t9 are sequentially changed to values to select the multi-bit A2, the multi-bit A3, the multi-bit A4, the multi-bit A5, the multi-bit A6 and the multi-bit A7, and then the data DQ-A2 to be written to the memory cell of the multi-bit A2, the data DQ-A3 to be written to the memory cell of the multi-bit A3, the data DQ-A4 to be written to the memory cell of the multi-bit A4, the data DQ-A5 to be written to the memory cell of the multi-bit A5, the data DQ-A6 to be written to the memory cell of the multi-bit A6 and the data DQ-A7 to be written to the memory cell of the multi-bit A7 are sequentially input from the input pad 1.

These input data DQ-A2, DQ-A3, DQ-A4, DQ-A5, DQ-A6 and DQ-A7 are sequentially latched by the multi-bit decoder & data latch circuit 4-A2 in charge of the multi-bit A2, the multi-bit decoder & data latch circuit 4-A3 in charge of the multi-bit A3, the multi-bit decoder & data latch circuit 4-A4 in charge of the multi-bit A4, the multi-bit decoder & data latch circuit 4-A5 in charge of the multi-bit A5, the multi-bit decoder & data latch circuit 4-A6 in charge of the multi-bit A6, and the multi-bit decoder & data latch circuit 4-A7 in charge of the multi-bit A7, respectively, and then sequentially written to the memory cells of the multi-bits A2, A3, . . . A7, respectively.

The data write operation of an EEPROM involves the electron injection into the floating gate of the memory cell, the write operation must be held for a long time (approx. 10 microseconds ($\mu$s) in FIG. 9) until the electron injection is completed, and the data writing of eight memory cells of the multi-bits A0 to A7 is completed by holding the write operation for approx. 10 $\mu$s from the data writing of the memory cell selected last, i.e., the multi-bit A7. During the above-described data writing period, the time required for inputting data DQ-A0 to DQ-A7 is approx. 350 nanoseconds in FIG. 9, which is very short as compared with the holding period for write operation of the above-mentioned approx. 10 $\mu$s.

As described above, in the case of a multi-bit write method, data are written to a plurality of memory cells during a long holding period of one write operation.

In a single bit write method, on the other hand, data is written to one memory cell during a long single holding period of one write operation (e.g. Japanese Patent Application Kokai No. 2000-331486 (FIG. 1, FIG. 3)).

FIG. 10 shows a timing chart of a conventional single bit writing for the EEPROM of FIG. 7, where the same reference numerals are assigned for the same elements as FIG. 9. Noted that in the above-described multi-bit writing, the data are written into eight memory cells of the multi-bits A0 to A7 within a single writing operation, and the address ADD covers the above-described multi-bits. In a single bit writing, on the other hand, the data is written into one memory cell within a single writing operation, and therefore the address ADD and the multi-bit address MBA cover only the above-described one memory cell. Accordingly, as shown in FIG. 10, the decode address a0 and the multi-bits A0, A1, A2, A3, . . . during the multi-bit writing constitute the decode addresses for the single bit writing such as a0+A0, a0+A1, a0+A2, a0+A3 and so on. As shown in FIG. 10, although each write operation has the same address ADD, i.e., all decode addresses are a0, each write operation, i.e., each memory cell, may has different address ADD in the single bit writing.

Before time t21, the row decoder 6 sets all M word lines WL1 to WLM and the two select lines SLodd and SLeven to GND level (0 volt). The multi-bit decoder & data latch circuits 4-A0 to 4-A7 all latch the H level as the initial data, and the latch inputs of these multi-bit decoder & data latch circuits 4-A0 to 4-A7 are all disconnected from the input pad 1.

At time t21, the address ADD and the multi-bit address MBA to select the decode address a0+A0 are input from the input pads 2 and 3.

When the row address among the address ADD to select the decode address a0 is input, the row decoder 6 selects the word line WLm and the odd select line SLodd, and applies approx. an 8.0 volts from the write voltage VPP to the word line WLm and the odd select line SLodd. Upon this voltage application, all the odd selectors turn ON so that the cell drain voltage CDV (approx. 0.6 volts in this case) is supplied to all the drain lines connected to these odd selectors.

When the column address among the address ADD to select the decode address a0 is input, the column decoder 5-Ak selects the bit line BLn-Ak, and connects the output of the multi-bit decoder & data latch circuit 4-Ak to this bit line BLn-Ak.

When the multi-bit address MBA to select the multi-bit A0 is input, the multi-bit decoder & data latch circuit 4-A0 connects the latch input to the input pad 1.

Then at time t22, the control signal CEB to be input to the cell drain voltage generator 7 from the input pad 16 changes from H level to L level, and then the write disabled period changes to the write operation period.

As described above, when the write disabled period changes to the write operation period, the cell drain voltage CDV to be output from the cell drain voltage generator 7 (see FIG. 8) rises from approx. 0.6 volts to approx. 5.0 volts.

When the cell drain voltage CDV rises to approx. 5.0 volts, the input data DQ-A0 latched by the multi-bit decoder & data latch circuit 4-A0 can be written to the memory cell 9 of the decode address a0+A0 selected by the word line WLm and the bit line BLn-A0.

During this write operation period, the data DQ-A0 is input from the input pad 1, and this input data DQ-A0 is latched by the multi-bit decoder & data latch circuit 4-A0, and is written to the memory call 9 of the decode address a0+A0. Holding of the write operation for approx. 10 μs from the start of the input of the data DQ completes the data writing.

When at time t23, that is after the holding of the write operation for approx. 10 μs, the control signal CEB to be input to the cell drain voltage generator 7 from the input pad 16 changes from L level to H level, and the write operation period ends so as to return to the write disabled period.

As described above, when the write operation period changes to the write disabled period, the cell drain voltage CDV to be output from the cell drain voltage generator 7 (see FIG. 8) falls from approx. 5.0 volts to approx. 0.6 volts.

Then at time t24, when the address ADD and the multi-bit address MBA input from the input pads 2 and 3 are changed from the values to select the decode address a0+A0 to the values to select the decode address a0+A1, the input data DQ-A1 is latched by the multi-bit decoder & data latch circuit 4-A1 and is written to the memory cell 10 of the decode address a0+A1 during t24 to t27, which are similar to those during t21 to t24 described above.

In the same way, the input data DQ-A2, DQ-A3 . . . are latched by the multi-bit decoder & data latch circuits 4-A2, 4-A3, . . . , and are written to the memory cells of the decode addresses a0+A2, a0+A3, . . . , during t27 to t30, . . . , respectively.

Accordingly, in the single bit write method, a specified time (approx. 10 μs in FIG. 10) multiplied by the number of all memory cells to which the data is written is required to hold the write operation. On the other hand, in the multi-bit write method, a specified time (approx. 10 μs in FIG. 9) multiplied by only ⅛ (1/the number of multi-bits) of the number used in the single bit write method described above is enough. Therefore if the data input cycle time in one multi-bit writing can be executed in several tens nanoseconds (approx. 350/8 nanoseconds in FIG. 9), then overall time required for writing all the memory cells by the multi-bit write method is approx. ⅛ (1/the number of multi-bits) of that of the single bit write method. Accordingly, the multi-bit write method offers advantage over the single bit write method.

This advantage of the multi-bit write method can be utilized for a memory tester etc. having capability to control a high-speed data input cycle (several tens nanoseconds or less), but a ROM writer for data writing used by a conventional ROM user cannot utilize the advantage of the multi-bit write method, since the data input cycle that can be controlled is limited to 4 to 5 μs.

If the multi-bit write method is executed in the ROM writer, it takes several tens μs to merely input data of all the multi-bits, which far exceeds the holding period for the write operation (approx. 10 μs in FIG. 9 and FIG. 10), thereby causing erroneous phenomena in data writing to a non-selected memory cell, i.e., phenomena of electron injection to the floating gate of the non-selected memory cell.

FIG. 11 shows a cross-sectional view of such erroneous phenomena, when L level latch data is written to the memory cell 9 in FIG. 7, in data writing to the non-selected memory cells 11, 12 and 13 having no injected electron connected to the selected word rows. In the floating gate 19 of the memory cell 9 where the GND level (0 volt) is supplied to the source 24 (bit line BLn), electrons have been injected and kept stored owing to the control gate 18 (word line WLm) to which approx. 8.0 volts of voltage is supplied and the drain 23 to which approx. 5.0 volts of cell drain voltage CDV is supplied.

On the other hand, since the cell drain voltage CDV of approx. 5.0 volts is supplied to the drain 25 of the memory cell 13, if the write operation in FIG. 11 is held for several tens μs, electrons may be injected into the floating gates 20, 21 and 22 having no injected electron of the non-selected memory cells 11 to 13, which are located between the source 24 and the drain 25 owing to the control gate 18 to which approx. 8.0 volts of voltage is supplied and the drain 25 to which approx. 5.0 volts of cell drain voltage CDV is supplied.

Because of the above-described reason, the ROM writer that holds the write operation for several tens μs during multi-bit writing employs the single bit write method instead of the multi-bit write method.

However, because of the recent miniaturization of processes and the increase in memory capacities, data retention phenomena in the non-selected cells can no longer be ignored, which poses another problem in a single bit writing method.

FIG. 12 shows a cross-sectional view of such data retention phenomena, when L level latch data is written to the memory cell 9 in FIG. 7, in the non-selected memory cell of the non-selected word row such as memory cell 14 for which electron injection has completed. During the write operation, cell drain voltage CDV (approx. 5.0 volts) is supplied to the drains of half of the entire memory cells by means of the odd selector and the even selector. In a non-selected memory cell where electrons have already been injected into the floating gate 27 and the GND level (0 volt) is supplied to the control gate 26, electrons held in the floating gate 27 jump the oxide film and reach the drain 29, if the cell drain voltage CDV of approx. 5.0 volts is being supplied to the drain 29 for a long time, even if the source 28 is open. Accordingly, such case may be increased that the electrons held in the floating gate 27 flow out to the supply line of the cell drain voltage CDV. As a result, electrons in the floating gate 27 decrease, which makes it difficult to read these memory cells.

This problem is more significant in the single bit writing having longer write operation. Further, this problem cannot be ignored as the oxide film between the floating gate and drain becomes thinner due to the miniaturization of the process, and as the time to apply a high cell drain voltage to non-selected memory cells during write operation becomes longer due to the capacity increase of the memories. As a result, a serious problem arises in that there is no way to write data in the case of a ROM writer where the limit of a data input cycle that can be controlled is 4 to 5 μs and the multi-bit writing cannot be employed.

SUMMARY OF THE INVENTION

It is an object of the present invention to allow the use of a multi-bit write system even if the data input takes a long time.

The data write circuit and the data write method according to the present invention are characterized in that a low cell drain voltage with which data cannot be written is applied during the data input period, and a high cell drain voltage for writing data is applied after the data input period ends.

According to the present invention, the time for applying a high cell drain voltage for writing data can be decreased, and therefore the multi-bit write system can be employed even if the data input takes a long time.

DETAILED DESCRIPTION OF THE INVENTION

First Embodiment

Figure 1:
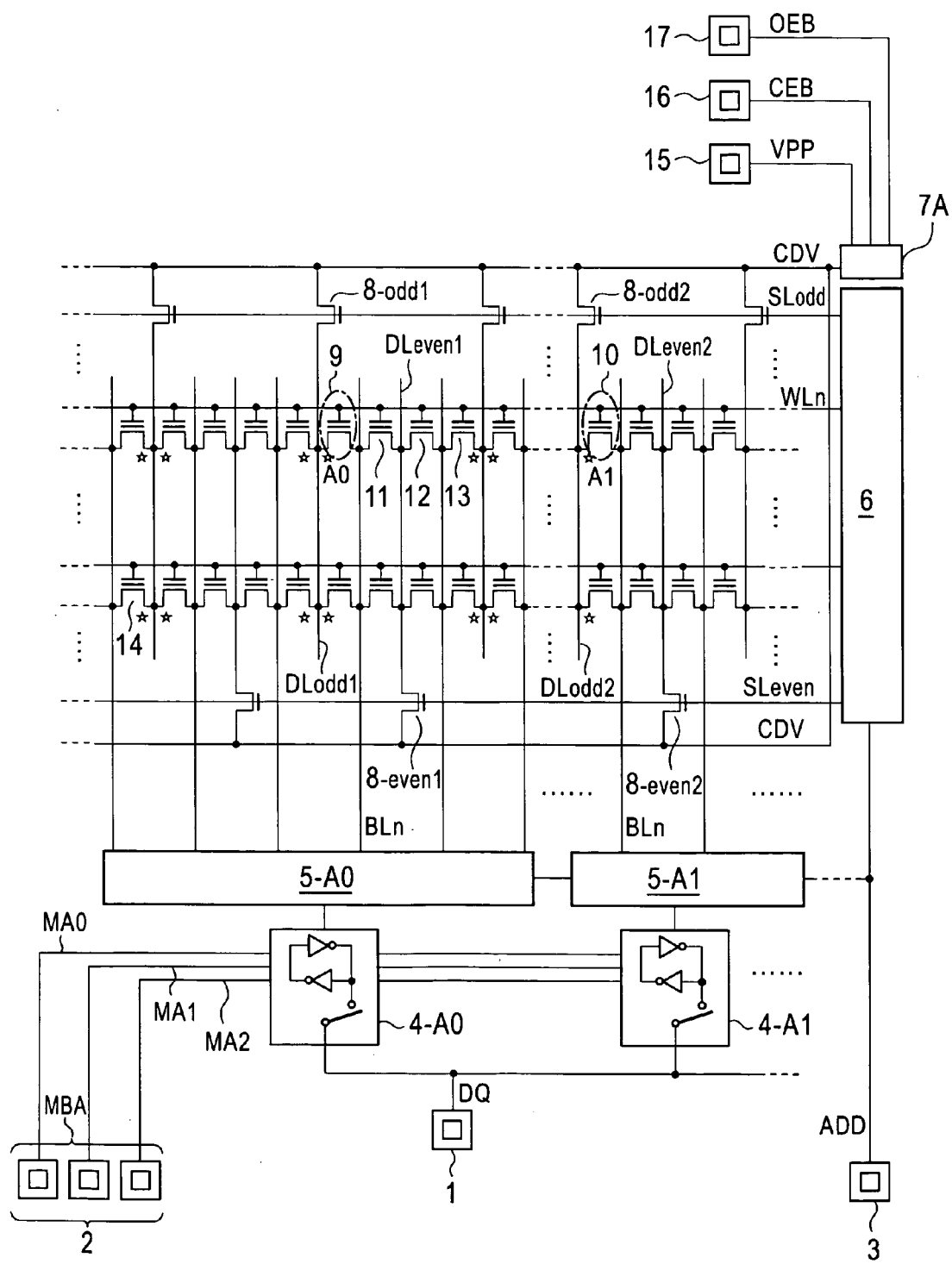
FIG. 1 shows a block diagram of the EEPROM according to a first embodiment of the present invention.
Figure 7:
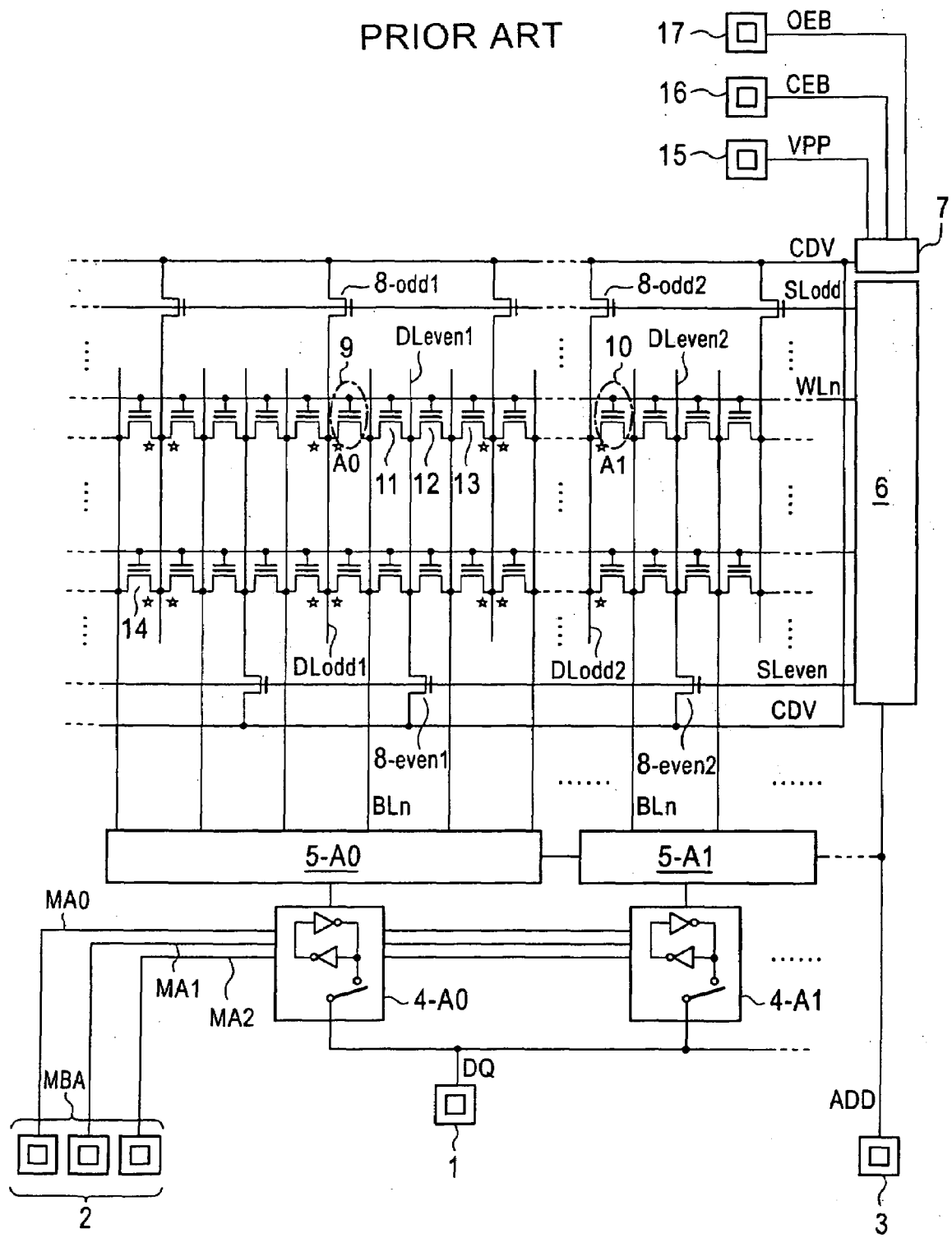
FIG. 7 shows a block diagram of a conventional EEPROM.

FIG. 1 shows a block diagram of an EEPROM according to a first embodiment of the present invention, in which the same reference numerals are assigned for the same elements of FIG. 7. The EEPROM of the first embodiment in FIG. 1 includes a memory cell array, a data write circuit of the first embodiment for writing data to memory cells in the memory call array, and input pads 1, 2, 3, 15, 16 and 17. Circuits such as a data read circuit for reading data from the memory cells in the memory cell array and an input circuit of a power supply voltage VCC are omitted from FIG. 1.

Referring to FIG. 1, the memory cell array includes M word lines WL (WL1, WL2, ..., WLM), 8×N bit lines BL (BL1-A0, BL2-A0, ..., BLN-A0, BL1-A1, ..., BLN-A1, BL1-A2, ..., BLN-A6, BL1-A7, ..., BLN-A7), M×N×8×2 non-volatile memory cells arranged in a matrix pattern (including memory cells 9, 10, 11, 12, 13 and 14), an odd select line SLodd, an even select line SLeven, a supply line of cell drain voltage CDV, a plurality of odd selectors (including odd selectors 8-odd1 and 8-odd2) each formed by an NMOS, a plurality of even selectors (including even selectors 8-even1 and 8-even2) each formed by an NMOS, and a plurality of drain lines (including drain lines DLodd1, DLodd2, DLeven1 and DLeven2).

Still referring to FIG. 1, the data write circuit of the first embodiment includes eight multi-bid decoder & data latch circuits 4 (4-A0, 4-A1, ..., 4-A7), eight column decoders 5 (5-A0, 5-A1, ..., 5-A7), a row decoder 6 and a cell drain voltage generator 7A so that multi-bit writing is possible in the memory cells consisting of eight multi-bits A0, A1, ..., A7.

The data write circuit of the first embodiment is similar to the conventional data write circuit in FIG. 7 except that the cell drain voltage generator 7 is replaced by a cell drain voltage generator 7A.

Memory Cell Array

Out of 16×M×N memory cells of the above-described memory call array, a memory cell group having 2×M×N memory cells are in charge of the multi-bit A0 (data are written thereto when the multi-bit A0 is selected). In the same way, each of the memory cell groups each having 2×M×N memory cells is in charge of each of the multi-bits A1, A2, ..., A7.

The sources of the memory cell group in charge of the multi-bit A0 having 2×M×N memory cells are connected to a bit line group BL1-A0 to BLN-A0 extending from the column decoder 5-A0 so that each of the bit lines is connected to 2×M memory cells. In the same way, the sources of each of the memory cell groups, of which each group is in charge of each of the multi-bits A1 to A7 and each group has 2×M×N memory cells, are connected to each of bit line groups BL1-A1 to BLN-A1, BL1-A2 to BLN-A2, ..., BL1-A7 to BLN-A7 extending from the column decoders 5-A1, 5-A2, ..., 5-A7 so that each of the bit lines is connected to 2×M memory cells. The drains of each of the memory cell groups, of which each group is in charge of each of the multi-bits A0 to A7 and each group has 2×M×N memory cells, are respectively connected to drain lines of interest among a plurality of drain lines.

A source of the memory cell 9 in charge of the multi-bit A0 is connected to a bit line BLn-A0 (n is an arbitrary integer from 1 to N) extending from the column decoder 5-A0, and a drain of the memory cell 9 is connected to the drain line DLodd1. A source of the memory cell 10 in charge of the multi-bit A1 is connected to the bit line BLn-A1 extending from the column decoder 5-A1, and a drain of the memory cell 10 is connected to the drain line DLodd2.

Control gates of the above-described 16×M×N memory cells are connected to M word lines WL1 to WLM extending from the row decoder 6 so that each word line is connected to 16×M control gates. 16 memory cells which are respectively in charge of the multi-bits A0 to A7 are connected to a word line.

The control gates of the memory cells 9, 11, 12 and 13 in charge of the multi-bit A0 and the memory cell 10 in charge of the multi-bit A1 are connected to the word line WLm (m is an arbitrary integer from 1 to M), and the control gate of the memory cell 14 in charge of the multi-bit A0 is connected to another word line which is different from the word line WLm.

Each of a plurality of odd selectors and a plurality of even selectors is disposed between each of a plurality of drain lines and the supply line of the cell drain voltage CDV extending from the cell drain voltage generator 7A. The odd select line SLodd extending from the row decoder 6 is connected to the gates of all the odd selectors, and the even select line SLeven extending from the row decoder 6 is connected to the gates of all the even selectors.

The odd selector 8-odd1 is disposed between the drain line DLodd1 and the supply line of the cell drain voltage CDV, and the odd selector 8-odd2 is disposed between the drain line DLodd2 and the supply line of the cell drain voltage CDV. The gates of the odd selectors 8-odd1 and 8-odd2 are both connected to the odd select line SLodd. The even selector 8-even1 is disposed between the drain line DLeven1 and the supply line of the cell drain voltage CDV, and the even selector 8-even2 is disposed between the drain line DLeven2 and the supply line of the cell drain voltage CDV. The gates of the even selectors 8-even1 and 8-even2 are both connected to the even select line SLeven.

Input Pad 1

The data DQ to be written to the memory cell is input to the input pad 1. This input pad 1 is connected to the inputs of the multi-bit decoder & data latch circuits 4-A0 to 4-A7. The data DQ to be written to the memory cells of the multi-bits A0, A1, . . . , A7 are assumed to be DQ-A0, DQ-A1, . . . , DQ-A7, respectively.

Input Pad 2

Three bits of MA0, MA1 and MA2 as the multi-bit address MBA for selecting eight multi-bits A0 to A7 are respectively input to three input pads 2. The multi-bit address MBA (MA0, MA1, MA2) is input to the multi-bit decoder & data latch circuits 4-A0 to 4-A7.

Input Pad 3

The address ADD formed by a column address and a row address (including odd/even select bits) is input to the input pad 3. The number of input pads 3 is the same as the number of bits forming the address ADD. Among the address ADD, the column address is input to the column decoders 5-A0 to 5-A7, and the row address is input to the row decoder 6.

Input Pad 15

Write voltage VPP (low voltage level corresponds to GND level (0 volt) and high voltage level corresponds to approx. 8.0 volts) is input to the input pad 15. This write voltage VPP is input to the row decoder 6 and the cell drain generator 7A.

Input Pads 16, 17

Control signal CEB is input to the input pad 16 and control signal OEB is input to the input pad 17. These control signals CEB and OEB are input to the cell drain voltage generator 7A together with the above-described write voltage VPP.

Control Signals CEB, OEB

In the conventional EEPROM (see FIG. 7), the control signal CEB is used for data writing, and the control signal OEB is used for data reading that is fixed to H level and does not function (the signal not for use) during the data writing. In the EEPROM, the cell drain voltage generator is used not only during the data writing but also during the data reading so that the cell drain voltage generator is configured to receive not only the control signal CEB for data writing but also the control signal OEB for data reading.

In the cell drain voltage generator 7A of the first embodiment, the above-described control signal CEB is used as a first writing control signal. Further, the above-described control signal OEB, which is conventionally not used during data writing, is used as a second writing control signal. The second writing control signal may be input to the cell drain voltage generator 7A separately from the control signal OEB.

Multi-bit Decoder & Data Latch Circuit 4

The number of multi-bit decoder & data latch circuits 4 is the same as the number of multi-bits. The multi-bit decoder & data latch circuit 4-Ak (k is an arbitrary number from 0 to 7) is in charge of the multi-bit Ak. The multi-bit decoder & data latch circuit 4-Ak latches H level as the initial data and decodes the multi-bit addresses MBA (MA0, MA1, MA2) which was input. When the multi-bit address MBA for selecting the multi-bit Ak is input, the multi-bit decoder & data latch circuit 4-Ak connects the latch input thereof to the input pad 1, and latches the data DQ-Ak to be written to the memory cell of the multi-bit Ak, whereas when the multi-bit address MBA for selecting the multi-bit Ak is not input, the multi-bit decoder & data latch circuit 4-Ak disconnects the latch input mentioned above from the input pad 1. The latch data (H level as the initial data, or input data DQ-Ak at H level or L level) is output to the column decoder 5-Ak. If the latch data is in H level, the voltage near the power supply voltage VCC (approx. 3.5 volts) is output to the column decoder 5-Ak, and if the latch data is at L level, GND level (0 volt) is output to the column decoder 5-Ak.

Once L level is latched, the data latch circuit of this multi-bit decoder & data latch circuit 4-Ak holds the latch at L level until initialization is executed, even if input becomes H level, but the data latch circuit may have such a configuration that the latch input is connected to the input pad 1 only during the input period of the data DQ-Ak, which is synchronized with the input timing of the data DQ-Ak.

Column Decoder 5

The number of column decoders 5 is the same as the number of multi-bits. The column decoder 5-Ak is in charge of the multi-bit Ak. The column decoder 5-Ak decodes the column address which was input, selects one out of N bit lines BL1-Ak to BLN-Ak, and connects the selected bit line to the latch output of the multi-bit decoder & data latch circuit 4-Ak.

Row Decoder 6

The row decoder 6 decodes the row address which was input, selects one out of M word lines WL1 to WLM and also selects either the odd select line SLodd or the even select line SLeven, and applies the voltage (approx. 8.0 volts) of the write voltage VPP to the selected word line and the select line.

Cell Drain Voltage Generator 7A

The cell drain voltage generator 7A generates the cell drain voltage CDV of either low voltage (approx. 0.6 volts) with which no data is written, or high voltage (approx. 5.0 volts) with which data is written depending on the write voltage VPP and the control signals CEB and OEB, and supplies this cell drain voltage CDV to all the odd selectors (including the odd selectors 8-odd1 and 8-odd2) and the even selectors (including the even selectors 8-even1 and 8-even2).

Figure 2:
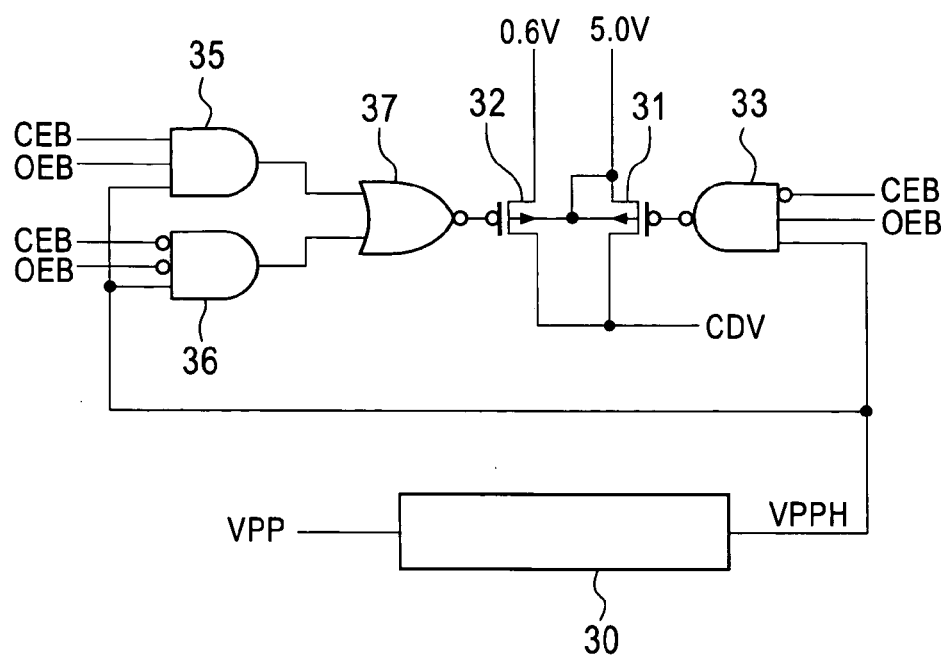
FIG. 2 shows an example of a logic circuit diagram of a cell drain voltage generator in a data write circuit of FIG. 1.
Figure 8:
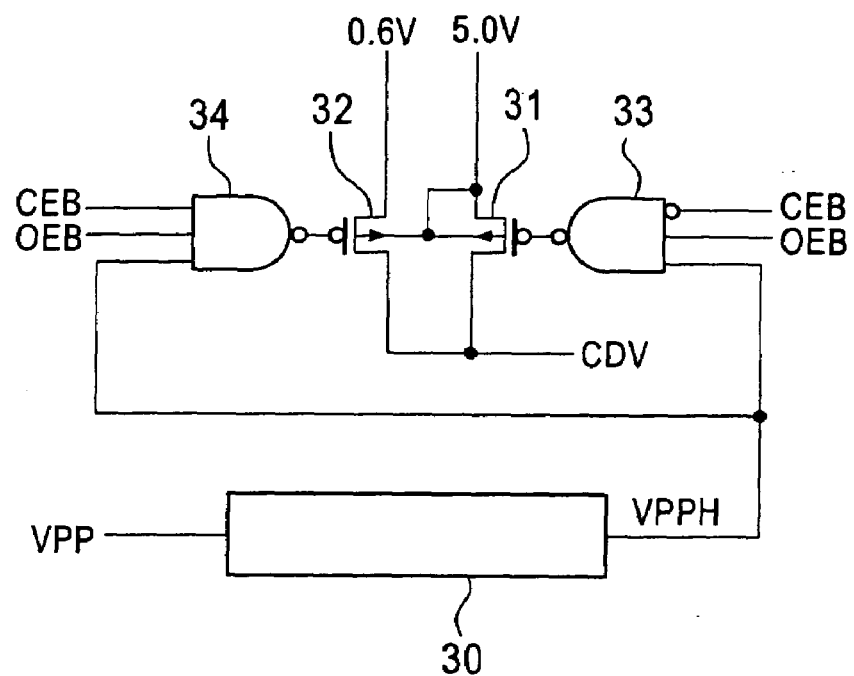
FIG. 8 shows an example of a logic circuit diagram of a cell drain voltage generator in a data write circuit of FIG. 7.

FIG. 2 shows an example of a logic circuit diagram in the cell drain voltage generator 7A of the first embodiment, in which the same reference numerals are assigned for the same elements as FIG. 8. As shown in FIG. 2, the cell drain voltage generator 7A includes a high voltage detection circuit 30, PMOS transistors 31 and 32, a three-input NAND gate 33, three-input AND gates 35 and 36, and a two-input NOR gate 37. Circuits for generating voltage of approx. 0.6 volts and approx. 5.0 volts are omitted from FIG. 2.

As described above, the cell drain voltage generator 7A of the first embodiment is similar to the conventional cell drain voltage generator 7 in FIG. 8 except that the NAND gate 34 is replaced by the AND gates 35 and 36 and NOR gate 37.

The high voltage detection circuit 30 outputs the write voltage detection signal VPPH, which becomes L level when the write voltage VPP to be input is low voltage level (GND level (0 volt)), and becomes H level when the write voltage VPP is high voltage level (approx. 8.0 volts).

The NAND gate 33 receives input signals of the write voltage detection signal VPPH, an inverted signal of the control signal CEB and the control signal OEB, and then outputs a NAND signal of these input signals. The AND gate 35 receives input signals of the write voltage detection signal VPPH, the control signal CEB and the control signal OEB, and then outputs an AND signal of these input signals. The AND gate 36 receives input signals of the write voltage detection signal VPPH, an inverted signal of the control signal CEB and an inverted signal of the control signal OEB, and then outputs an AND signal of these input signals. The NOR gate 37 receives the output signals of the AND gates 35 and 36, and then outputs a NOR signal of these output signals.

In the PMOS transistor 31, a source is connected to the voltage generation circuit of approx. 5.0 volts, a gate is connected to the output of the NAND gate 33, and a drain is connected to the output of the cell drain voltage CDV of the cell drain voltage generator 7A so that the PMOS transistor 31 outputs a cell drain voltage CDV of approx. 5.0 volts depending on the output signal of the NAND gate 33. In the PMOS transistor 32, a source is connected to the voltage generation circuit of approx. 0.6 volts, a gate is connected to the output of the NOR gate 37, and a drain is connected to the output of the cell drain voltage CDV of the cell drain voltage generator 7A to which the drain of the PMOS transistor 31 is also connected so that the PMOS transistor 32 outputs a cell drain voltage of approx. 0.6 volts depending on the output signal of the NOR gate 37.

The cell drain voltage generator 7A of the first embodiment includes a high voltage detection circuit 30, in a similar manner as the conventional cell drain voltage generator 7 in FIG. 8, which outputs the write voltage detection signal VPPH that becomes L level when the write voltage VPP to be input is low voltage level (GND level (0 volt) and becomes H level when the write voltage VPP becomes high voltage level (approx. 8 volts). Accordingly, the circuit of the cell drain voltage generator 7A outputs a cell drain voltage CDV of either approx. 0.6 volts or approx. 5.0 volts depending on the logic of the write voltage detection signal VPPH and the control signals CEB and OEB.

Figure 3:
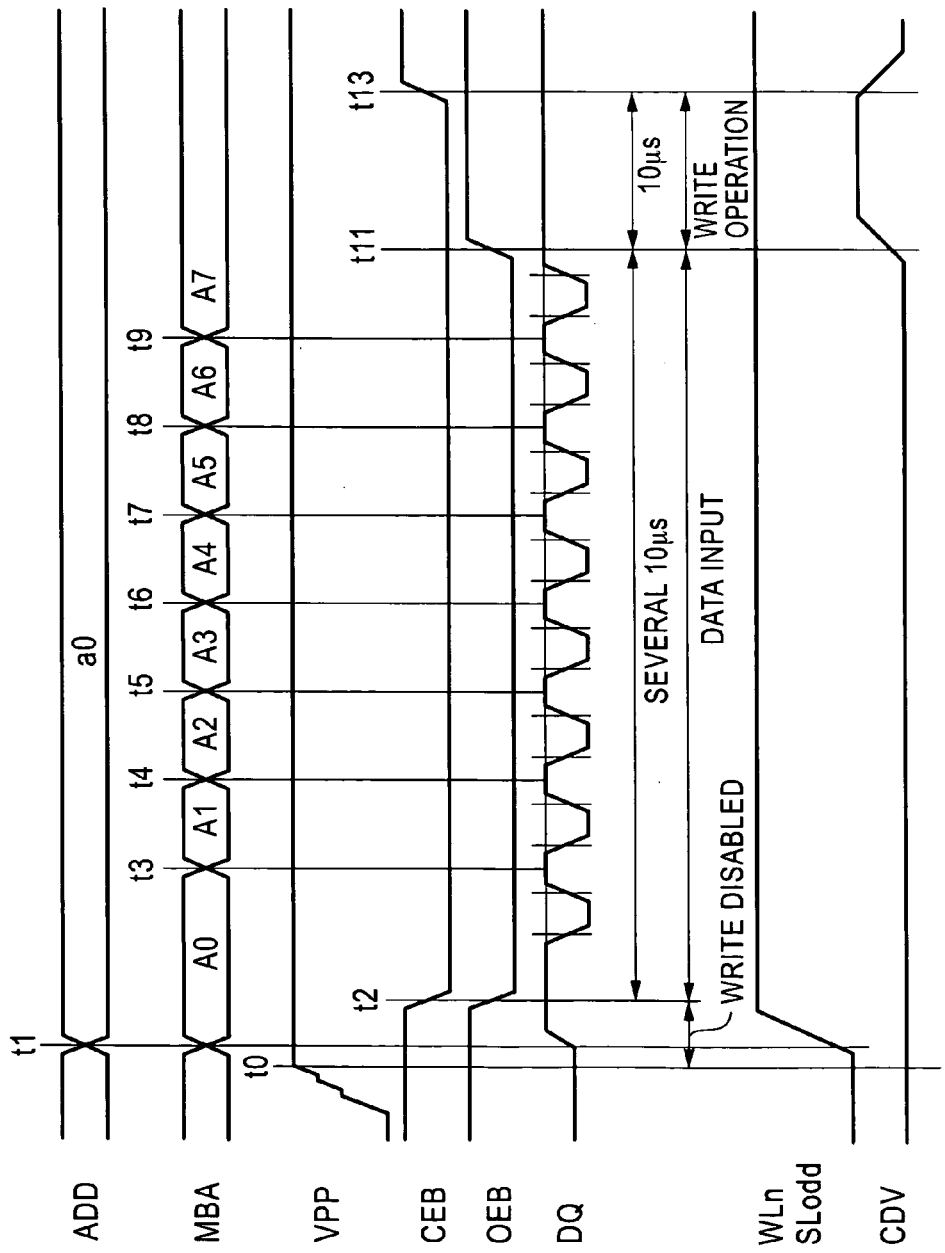
FIG. 3 shows a timing chart of multi-bit writing according to the first embodiment of the present invention.
Figure 9:
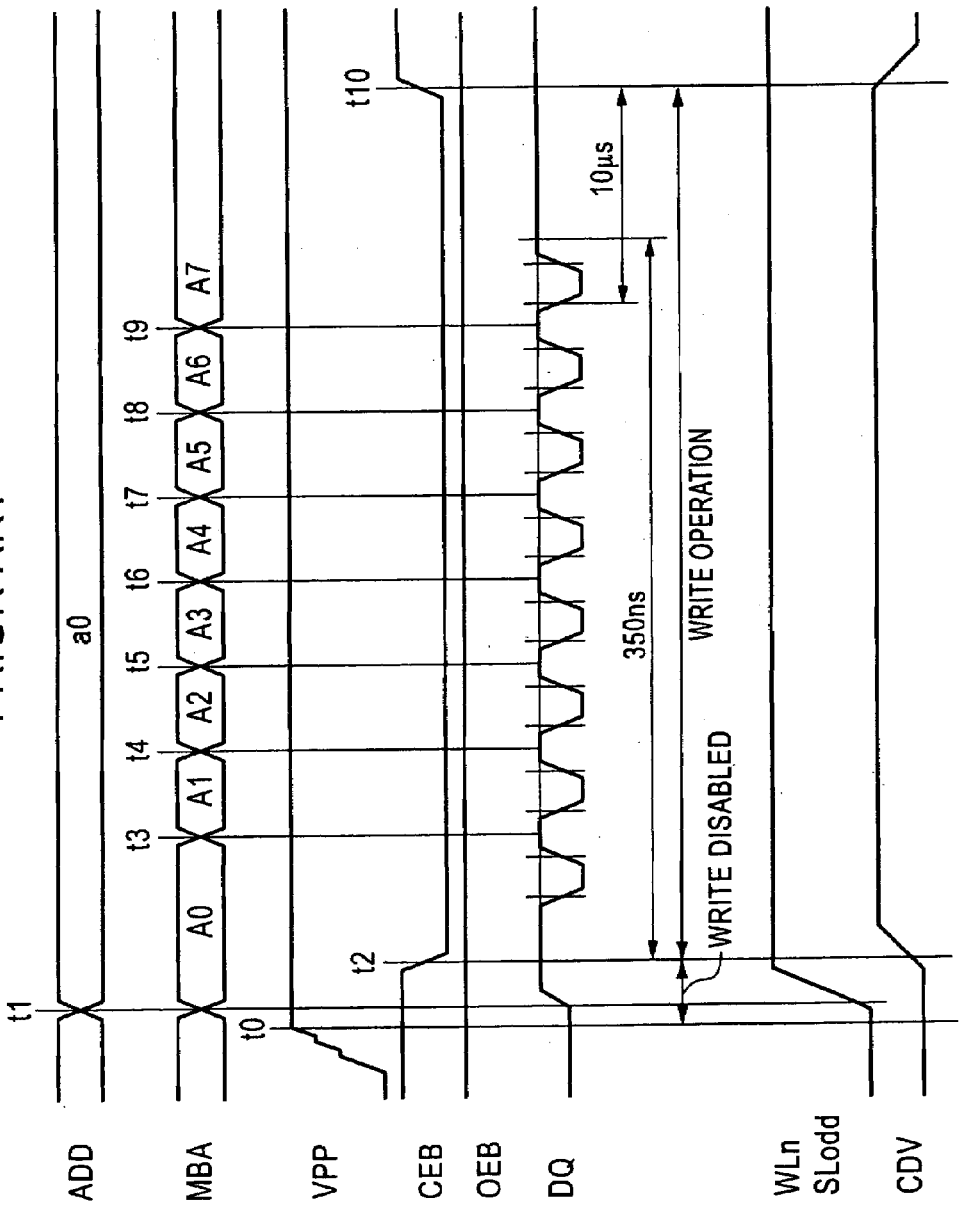
FIG. 9 shows a timing chart of conventional multi-bit writing.
Figure 10:
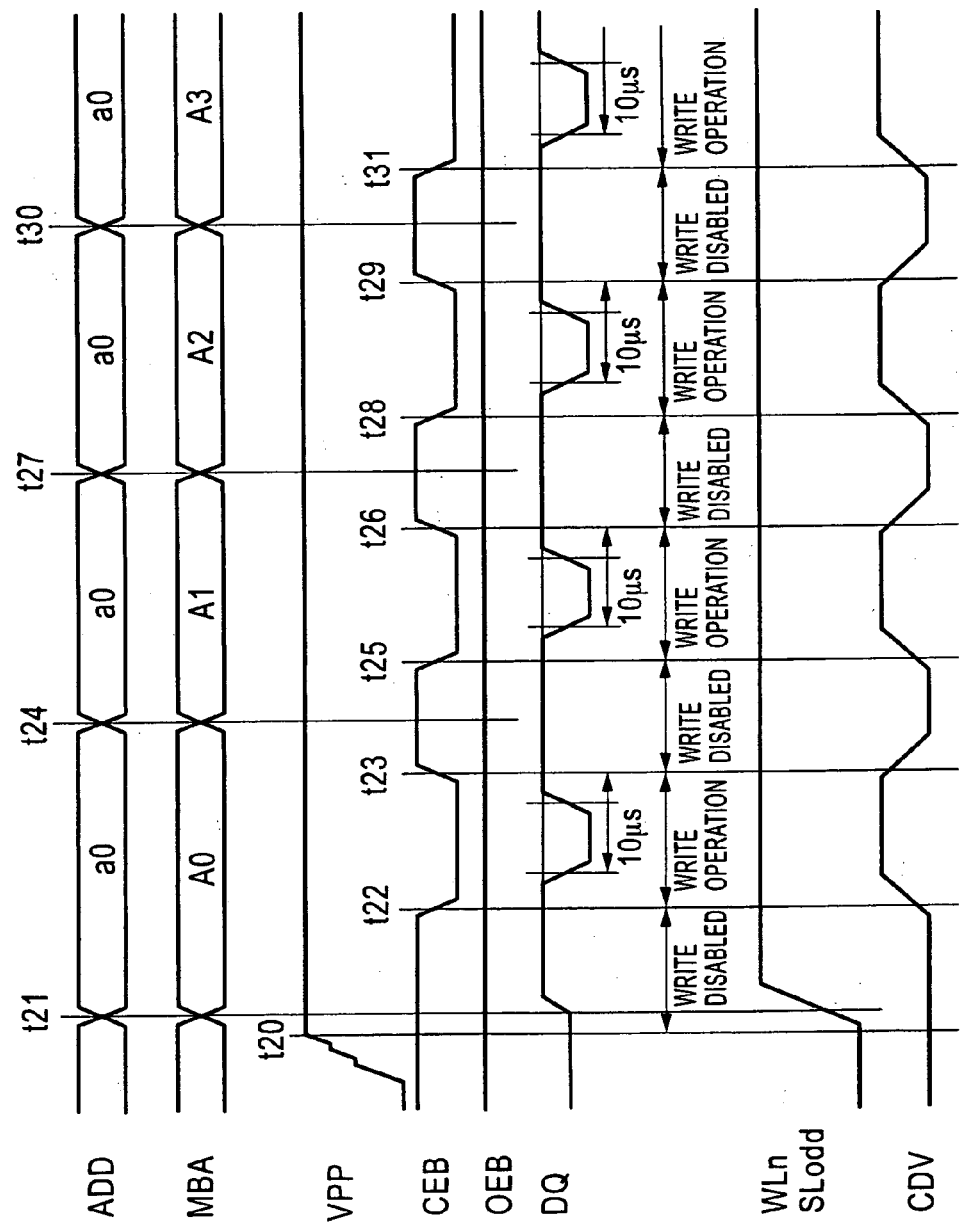
FIG. 10 shows a timing chart of conventional single bit writing.

FIG. 3 shows a timing chart of multi-bit writing in an EEPROM according to the first embodiment of the present invention, in which the same reference numerals are assigned for the same elements as FIG. 9. In the case of the above-described conventional multi-bit writing as shown in FIG. 9, the write disabled period changes to the write operation period (including data input period) by changing the logic from VPPH (VPP)/CEB/OEB=H level (high voltage level)/H level/H level to VPPH (VPP)/CEB/OEB=H level (high voltage level)/L level/H level. On the other hand, but in the multi-bit writing of the first embodiment as shown in FIG. 3, the write disabled period change to the data input period by changing the logic from VPPH (VPP)/CEB/OEB=H level (high voltage level)/H level/H level to VPPH (VPP)/CEB/OEB=H level (high voltage level)/L level/L level, and after the completion of the data input period, the write operation period starts by changing the logic from VPPH (VPP)/CEB/OEB=H level (high voltage level)/L level/L level to VPPH (VPP)/CEB/OEB=H level (high voltage level)/L level/H level.

As shown in FIG. 3, before time t0, the write voltage detection signal VPPH (write voltage VPP) and the control signals CEB and OEB are VPPH (VPP)/CEB/OEB=L level (low voltage level)/H level/H level, and in the cell drain voltage generator 7A (see FIG. 2), the outputs of the NAND gate 33 and the NOR gate 37 are both H level, and the PMOS transistors 31 and 32 are both OFF. The row decoder 6 sets all of M word lines WL1 to WLM and two select lines SLodd and SLeven to GND level (0 volt). All the multi-bit decoder & data latch circuits 4-A0 to 4-A7 latch H level as the initial data, and the latch inputs of the multi-bit decoder & data latch circuits 4-A0 to 4-A7 are all disconnected from the input pad 1.

Then at time t0, when the write voltage VPP to be supplied to the row decoder 6 and the cell drain voltage generator 7A from the input pad 15 changes from low voltage level (GND level) to high voltage level (approx. 8.0 volts), the write voltage detection signal VPPH changes from L level to H level. Consequently, in the cell drain voltage generator 7A, the output of the AND gate 35 becomes H level and the output of the NOR gate 37 becomes L level, and thus the PMOS transistor 32 turns ON so that a cell drain voltage CDV of approx. 0.6 volts is output from the cell drain voltage generator 7A.

Then at time t1, MA0/MA1/MA2=L level/L level/L level for selecting the multi-bit A0 is input from the input pad 2 as the multi-bit address MBA. Further, according to an example in FIG. 3, the address ADD for selecting the decode address a0 of the word line WLm, the odd select line SLodd and the bit lines BLn-A0 to BLn-A7 is input from the input pad 3.

When the row address among the address ADD for selecting the decode address a0 is input, the row decoder 6 selects the word line WLm from M word lines WL1 to WLM, and selects the odd select line SLodd from two select lines SLodd and SLeven, and applies approx. 8.0 volts from the write voltage VPP to the word line WLm and the odd select line SLodd. Upon this voltage application, all the odd selectors (including odd selectors 8-odd1 and 8-odd2) turn ON so that the cell drain voltage CDV (approx. 0.6 volts in this case) is supplied to all the drain lines (including drain lines DLodd1 and DLodd2) connected to these odd selectors.

When the column address among the address ADD for selecting the decode address a0 is input, the column decoder 5-Ak in charge of the multi-bit Ak selects the bit line BLn-Ak, and connects the output of the multi-bit decoder & data latch circuit 4-Ak in charge of the multi-bit Ak to this bit line BLn-Ak.

When the multi-bit address MBA of MA0/MA1/MA2=L level/L level/L level to select the multi-bit A0 is input, the multi-bit decoder & data latch circuit 4-A0 in charge of multi-bit A0 connects the latch input to the input pad 1.

Then at time t2, the control signals CEB and OEB to be input to the cell drain voltage generator 7A from the input pads 16 and 17, respectively, both change from H level to L level, and then the write disabled period changes to the data input period.

When the write disabled period changes to the data input period as described above, the logic changes from VPPH (VPP)/CEB/OEB=H level (high voltage level)/H level/H level to VPPH (VPP)/CEB/OEB=H level (high voltage level)/L level/L level. In the case of the cell drain voltage generator 7A (see FIG. 2), the output of the NAND gate 33 remains at H level. The output of the AND gate 35 changes from H level to L level and the output of the AND gate 36 changes from L level to H level, but the output of the NOR gate 37 remains at L level. Therefore, the PMOS transistor 31 remains OFF, the PMOS transistor 32 remains ON, and thus the cell drain voltage CDV at low voltage level (approx. 0.6 volts), which is the same as that in the write disabled period, is continuously output from the cell drain voltage generator 7A even though the write disabled period changes to the data input period.

As described above, according to the first embodiment, the cell drain voltage CDV to be output from the cell drain voltage generator 7A remains at low voltage level (approx. 0.6 volts), which is the same as that in the write disabled period, even though the write disabled period changes to the data input period, so that no electron is injected into the floating gate of the memory cell even if the selected bit lines BLn-A0 to BLn-A7 become GND level during the data input period.

During this data input period, in a manner similar to the conventional multi-bit writing, the eight data of DQ-A0 to DQ-A7 to be respectively written to the eight multi-bits A0 to A7 are sequentially input from the input pad 1, and these data are latched by the multi-bit decoder & data latch circuits 4-A0 to 4-A7 which are in charge of the multi-bits A0 to A7, respectively.

When the data DQ-A0, which is either at H level or L level, to be written to the memory cell of the multi-bit A0 is input from the input pad 1, the multi-bit decoder & data latch circuit 4-A0 in charge of the multi-bit A0, which is being selected at this time, latches the input data DQ-A0 instead of the initial data (H level).

Then, at time t3, when the multi-bit address MBA to be input from the input pad 2 changes from MA0/MA1/MA2=L level/L level/L level for selecting the multi-bit A0 to MA0/MA1/MA2=H level/L level/L level for selecting the multi-bit A1, the multi-bit decoder & data latch circuit 4-A0 in charge of the multi-bit A0 disconnects the latch input from the input pad 1, and the multi-bit decoder & data latch circuit 4-A1 in charge of the multi-bit A1 connects the latch input to the input pad 1.

Then, when the data DQ-A1 to be written to the memory cell of the multi-bit A1 is input from the input pad 1, the multi-bit decoder & data latch circuit 4-A1 in charge of the multi-bit A1, which is being selected at this time, latches the input data DQ-A1 instead of the initial data (H level).

In the same way, at time t4 when the multi-bit address MBA to be input from the input pad 2 changes from MA0/MA1/MA2=H level/L level/L level for selecting the multi-bit A1 to MA0/MA1/MA2=L level/H level/L level for selecting the multi-bit A2, the multi-bit decoder & data latch circuit 4-A1 in charge of the multi-bit A1 disconnects the latch input from the input pad 1, and the multi-bit decoder & data latch circuit 4-A2 in charge of the multi-bit A2 connects the latch input to the input pad 1.

Then the data DQ-A2 to be written to the memory cell of the multi-bit A2 is input from the input pad 1, the multi-bit decoder & data latch circuit 4-A2 in charge of the multi-bit A2, which is being selected at this time, latches the input data DQ-A2 instead of the initial data (H level).

In the same way, the multi-bit addresses MBA to be input from the input pad 2 at times t5, t6, t7, t8 and t9 are sequentially changed to MA0/MA1/MA2=H level/H level/L level for selecting the multi-bit A3, MA0/MA1/MA2=L level/L level/H level for selecting the multi-bit A4, MA0/MA1/MA2=H level/L level/H level for selecting the multi-bit A5, MA0/MA1/MA2=L level/H level/H level for selecting the multi-bit A6, and MA0/MA1/MA2=H level/H level/H level for selecting the multi-bit A7, and then the data DQ-A3 to be written to the memory cell of the multi-bit A3, data DQ-A4 to be written to the memory cell of the multi-bit A4, data DQ-A5 to be written to the memory cell of the multi-bit A5, data DQ-A6 to be written to the memory cell of the multi-bit A6, and data DQ-A7 to be written to the memory cell of the multi-bit A7 are sequentially input from the input pad 1, and these input data DQ-A3, DQ-A4, DQ-A5, DQ-A6 and DQ-A7 are sequentially latched by the multi-bit decoder & data latch circuit 4-A3 in charge of the multi-bit A3, the multi-bit decoder & data latch circuit 4-A4 in charge of the multi-bit A4, the multi-bit decoder & data latch circuit 4-A5 in charge of the multi-bit A5, the multi-bit decoder & data latch circuit 4-A6 in charge of the multi-bit A6, and the multi-bit decoder & data latch circuit 4-A7 in charge of the multi-bit A7, respectively.

The input data DQ-A0 to DQ-A7, which are respectively latched by the multi-bit decoder & data latch circuits 4-A0 to 4-A7, will be applied to the sources of the memory cells of the multi-bits A0 to A7 via the column decoders 5-A0 to 5-A7 and the bit lines BLn-A0 to BLn-A7, respectively. During data input period, since the cell drain voltage CDV, which is applied to the drains of the memory cells of the multi-bits A0 to A7 from the cell drain voltage generator 7A via the odd selector, remains at low voltage level (approx. 0.6 volts), no electron is injected into the floating gates of the memory cells even if the input data DQ are at L level, and therefore the input data DQ-A0 to DQ-A7 are not written to the memory cells of the multi-bits A0 to A7.

Then at time t11, the control signal OEB to be input to the cell drain voltage generator 7A from the input pad 17 changes from L level to H level, and then the data input period ends and the write operation period starts.

As described above, when the logic changes from VPPH (VPP)/CEB/OEB=H level (high voltage level)/L level/L level to VPPH (VPP)/CEB/OEB=H level (high voltage level)/L level/H level, and the data input period changes to the write operation period, the output of the AND gate 36 changes from H level to L level, the output of the NOR gate 37 changes from L level to H level, and the output of the AND gate 33 changes from H level to L level which is opposite from the output of the NOR gate 37, in the cell drain voltage generator 7A (see FIG. 2). Consequently, the PMOS transistor 32 turns OFF and the PMOS transistor 31 turns ON so that the cell drain voltage CDV to be output from the cell drain voltage generator 7A rises from approx. 0.6 volts to approx. 5.0 volts.

In the case of a memory cell where approx. 8.0 volts is applied to the control gate from the word line WLm and the source is connected to the latch output of the multi-bit decoder & data latch circuit 4-Ak via the bit line BLn-Ak and column decoder 5-Ak, rise of the cell drain voltage CVD applied to the drain to approx. 5.0 volts causes an electron injection into the floating gate if the latch data of the multi-bit decoder & data latch circuit 4-Ak is at L level and the voltage to be applied from the bit line BLn-Ak to the source is GND level (0 volt). On the other hand, the rise of the cell drain voltage CVD to approx. 5.0 volts causes no electron injection into the floating gate if the latch data of the multi-bit decoder & data latch circuit 4-Ak is at H level and the voltage to be applied from the bit line BLn-Ak to the source is close to the power supply voltage VCC (approx. 3.5 volts).

In other words, if the cell drain voltage CDV rises to approx. 5.0 volts, the input data DQ-Ak that is latched by the multi-bit decoder & data latch circuit 4-Ak can be written to the memory cell of the multi-bits Ak selected by the word line WLm and the bit line BLn-Ak.

Therefore, when the data input period in which the cell drain voltage CDV remains at approx. 0.6 volts changes to the write operation period in which the cell drain voltage CDV rises to approx. 5.0 volts, the input data DQ-A0 to DQ-A7 latched by the multi-bit decoder & data latch circuits 4-A0 to 4-A7 are written in the memory cells of the multi-bits A0 to A7, respectively, and then the data writing is completed by holding the write operation for approx. 10 μs from the start of the write operation period.

Then, at time t12 that is after holding of the write operation for approx. 10 μs in which the cell drain voltage CDV of approx. 5.0 volts for data writing is simultaneously applied to the drains of the memory cells of the multi-bits A0 to A7, the control signal CEB input to the cell drain voltage generator 7A from the input pad 16 changes from L level to H level. Accordingly, the write operation period ends.

As described above, when the logic changes from VPPH (VPP)/CEB/OEB=H level (high voltage level)/L level/H level to VPPH (VPP)/CEB/OEB=H level (high voltage level)/H level/H level and the write operation period ends, the output of the NAND gate 33 changes from L level to H level, the output of the AND gate 35 changes from L level to H level, and the output of the NOR gate 37 changes from H level to L level which is opposite from the NAND gate 33, in the cell drain voltage generator 7A (see FIG. 2), and thus the PMOS transistor 31 turns OFF and the PMOS transistor 32 turns ON so that the cell drain voltage CDV to be output from the cell drain voltage generator 7A falls from approx. 5.0 volts to approx. 0.6 volts.

The data read operation in the EEPROM of the first embodiment will be hereinafter described. In the memory cell, when electrons are injected into the floating gate, the threshold voltage rises more than that of the floating gate having injected electron. Therefore if a voltage between the threshold voltage when no electron is injected into the floating gate and the threshold voltage when electrons are injected is applied to the control gate, a memory cell where no electron is injected into the floating gate turns ON, whereas a memory cell where the electrons are injected into the floating gate does not turn ON. Therefore when a voltage between the above-described threshold voltages is applied to the control gate, the data written in the memory cell can be read by sensing whether the memory cell is ON or OFF using a sense amplifier.

In this case, the voltage between the above-described threshold values is assumed to be a voltage near the power supply voltage VCC (approx. 3.5 volts), and the row decoder 6 applies the voltage near the power supply voltage VCC to the selected word line (e.g. word line WLm), and applies the GND level (0 volt) to other word lines. The column decoder 5-Ak connects the selected bit line (e.g. bit line BLn-Ak) to an input of the sense amplifier. When the control signals CEB and OEB change the logic from CEB/OEB=H level/H level to CEB/OEB=H level/L level and the data read period starts, the cell drain voltage generator 7A outputs the cell drain voltage CDV at the GND level (0 volt).

Consequently, in the memory cell from which data is read (e.g. memory cell 9), the voltage between the threshold voltage when no electron is injected into the floating gate and the threshold voltage when electrons are injected is applied to the control gate, and the GND level is applied to the drain. Further, the source is connected to the input of the sense amplifier. This enables the memory cell to turn ON, i.e., current flows between the source and the drain (the source also becomes GND level) if no electron has been injected into the floating gate, or remain OFF, i.e., no current flows between the source and the drain (the source becomes floating) if electrons has been injected into the floating gate.

Figure 11:
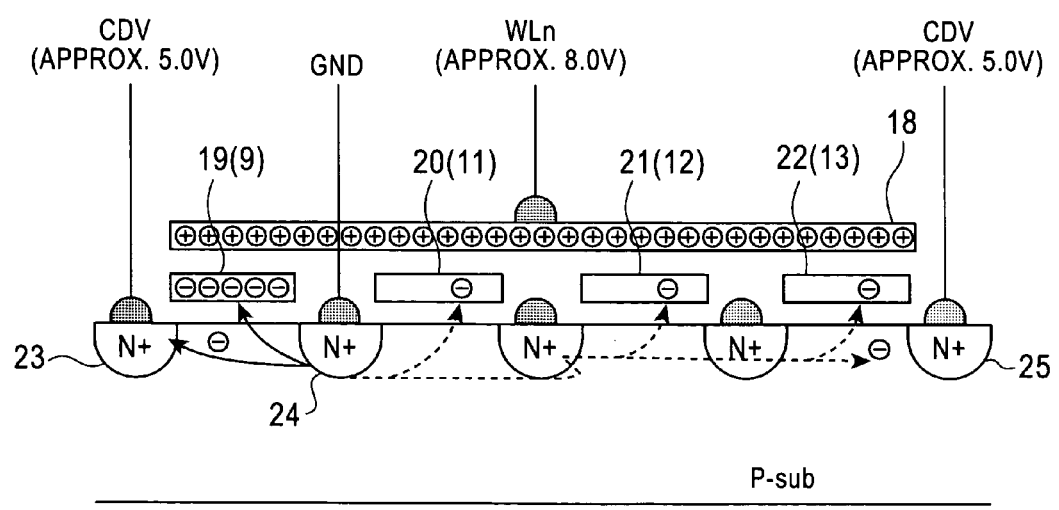
FIG. 11 shows a cross-sectional view of the erroneous phenomena of data writing.
Figure 12:
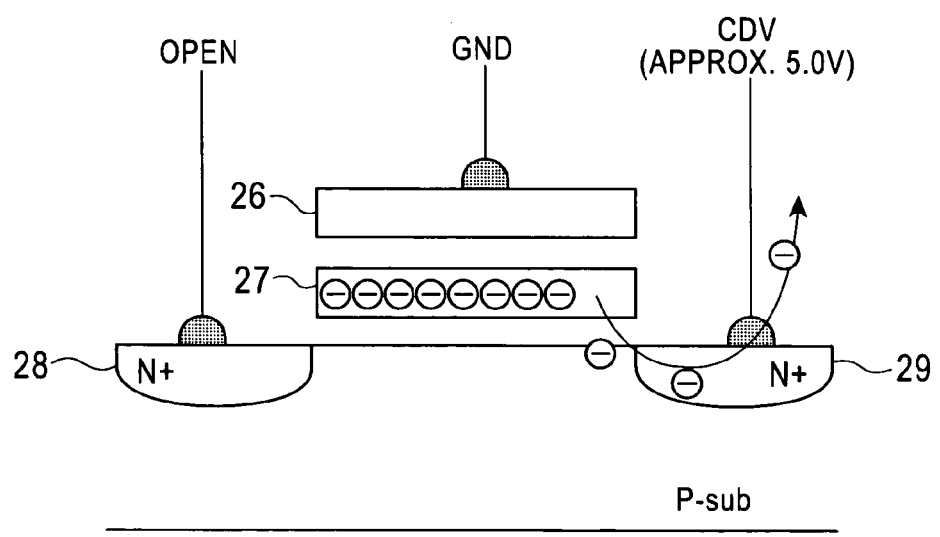
FIG. 12 shows a cross-sectional view of the data retention phenomena.

As described above, according to the first embodiment, the data input period is established, and high cell drain voltage for data writing is applied to the drain of the memory cell after the completion of the input and latch of eight data corresponding to the number of multi-bits. Accordingly, the high cell drain voltage for writing is not applied to the drain of the memory cell during data input, even in the case of writing by the ROM writer which requires such a long time period of several tens μs to input eight data corresponding to the number of multi-bits, and therefore the high cell drain voltage for writing is not applied for a long time, thereby avoiding the erroneous phenomena of the data writing in FIG. 11 which occurs in the non-selected memory cell of the selected word row due to stress caused by the long time application of the high cell drain voltage for writing. Accordingly, multi-bit writing can be achieved. By employing the multi-bit write method, the application time of the high cell drain voltage for writing to non-selected memory cell in the non-selected word row decreases to ⅛ (1/the number of multi-bits) as compared with that of the single bit write method, and therefore the data retention phenomena in FIG. 12 which occurs in the non-selected memory cell of the non-selected word row, can be suppressed.

Second Embodiment

Figure 4:
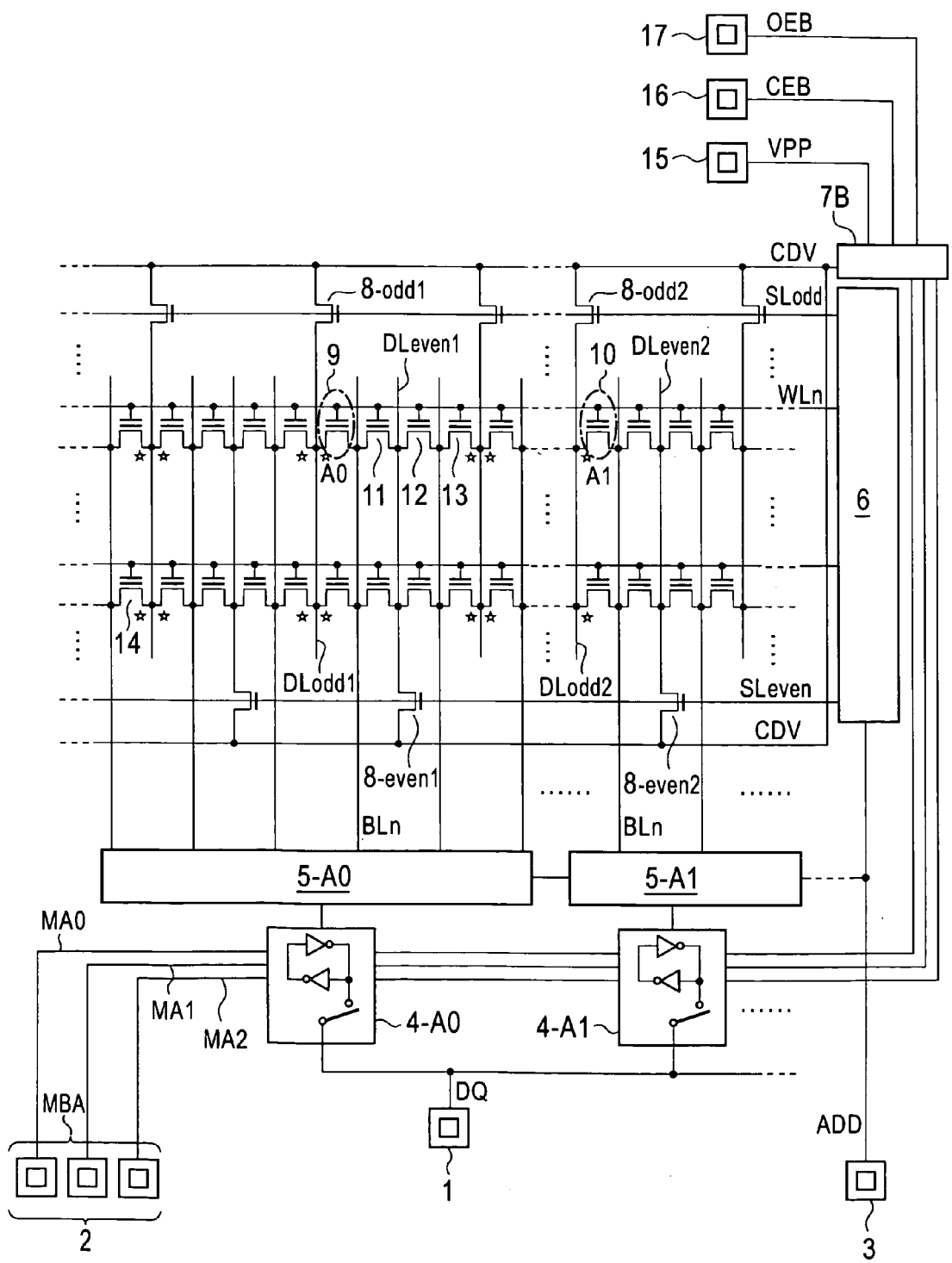
FIG. 4 shows a block diagram of an EEPROM according to a second embodiment of the present invention.

FIG. 4 shows a block diagram of an EEPROM according to a second embodiment of the present invention, in which the same reference numerals are assigned for the same elements of FIG. 1 and FIG. 7. The EEPROM of the second embodiment in FIG. 4 includes a memory cell array having the same configuration as that in the first embodiment, a data write circuit of the second embodiment for writing data to memory cells in the memory cell array, and input pads 1, 2, 3, 15, 16 and 17. In a manner similar to FIG. 1, circuits such as a data read circuit for reading data from the memory cells in the memory cell array and an input circuit of the power supply voltage VCC are omitted from FIG. 4.

Referring to FIG. 4, the data write circuit of the second embodiment includes eight multi-bit decoder & data latch circuits 4 (4-A0, 4-A1, . . . , 4-A7), eight column decoders 5 (5-A0, 5-A1, . . . , 5-A7), a row decoder 6 and a cell drain voltage generator 7B.

The data write circuit of the second embodiment is similar to the data write circuit of the first embodiment in FIG. 1 or the conventional data write circuit in FIG. 7 except that the cell drain voltage generator 7A or 7 is replaced by a cell drain voltage generator 7B, and bits MA0, MA1 and MA2 of the multi-bit address MBA are input to this cell drain voltage generator 7B.

Cell Drain Voltage Generator 7B

The cell drain voltage generator 7B generates the cell drain voltage CDV of either low voltage (approx. 0.6 volts) with which no data is written, or high voltage (approx. 5.0 volts) with which data is written depending on the write voltage VPP, the control signals CEB and OEB, and the multi-bit addresses MA0, MA1 and MA2, and supplies this cell drain voltage CDV to all the odd selectors (including odd selectors 8-odd1 and 8-odd2) and the even selectors (including even selectors 8-even1 and 8-even2).

Figure 5:
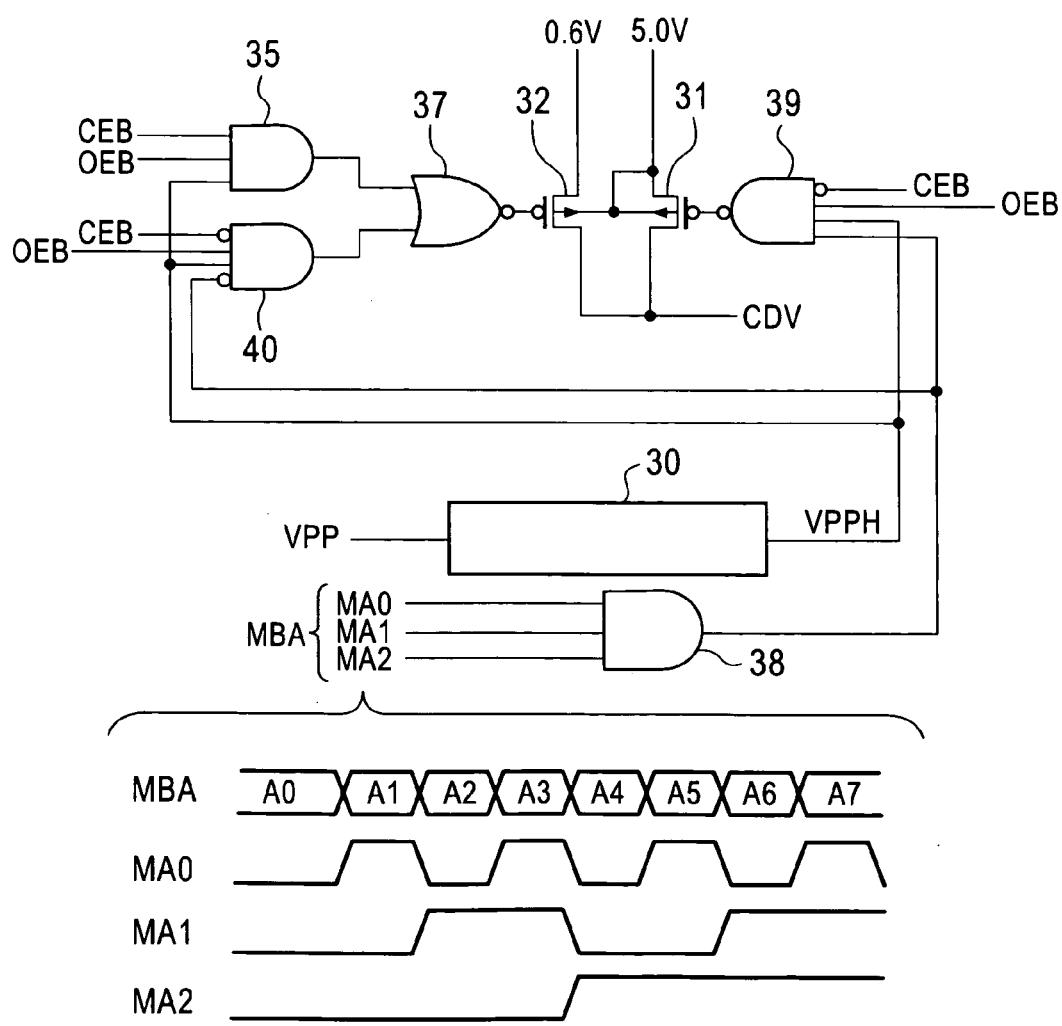
FIG. 5 shows an example of a logic circuit diagram of a cell drain voltage generator in a data write circuit of FIG. 4.

FIG. 5 shows an example of a logic circuit diagram in the cell drain voltage generator 7B of the second embodiment, in which the same reference numerals are assigned for the same elements as FIG. 2 and FIG. 8. As shown in FIG. 5, the cell drain voltage generator 7B includes a high voltage detection circuit 30, PMOS transistors 31 and 32, a three-input AND gate 35, a two-input NOR gate 37, a three-input AND gate 38, a four-input NAND gate 39 and a four-input AND gate 40. In a manner similar to FIG. 2, circuits for generating approx. 0.6 volts and approx. 5.0 volts are omitted from FIG. 5.

As described above, the cell drain voltage generator 7B of the second embodiment is similar to the conventional cell drain voltage generator 7 of FIG. 8 except that the AND gate 38 is provided, the NAND gate 33 is replaced by the NAND gate 39, and the NAND gate 34 is replaced by the AND gates 35 and 40 and the NOR gate 37. Further, the cell drain voltage generator 7B of the second embodiment is similar to the cell drain voltage generator 7A of the first embodiment in FIG. 2 except that the AND gate 38 is provided, and the three-input NAND gates 33 and 36 are replaced by the four-input NAND gates 39 and 40, respectively.

The AND gate 38 receives the multi-bit addresses MA0, MA1 and MA2, and outputs the AND signal of these input signals. The multi-bit addresses MA0, MA1 and MA2 and the multi-bits A0 to A8 to be selected in accordance with such multi-bit addresses have a correlation shown in FIG. 5. According to the correlation, and the multi-bit A0 with which all the multi-bit addresses MA0, MA1 and MA2 become L level is selected first, and the multi-bit A7 with which all the multi-bit addresses MA0, MA1 and MA2 become H level is selected last. Therefore the output signal of the AND gate 38 is at L level while the multi-bits A0 to A6 are selected, and changes from L level to H level when the last multi-bit A7 is selected.

The NAND gate 39 receives input signals of the write voltage detection signal VPPH, an inverted signal of the control signal CEB, the control signal OEB and an output signals of the AND gate 38, and then outputs a NAND signal of these input signals to the gate of the PMOS transistor 31. The AND gate 40 receives input signals of the write voltage detection signal VPPH, an inverted signal of the control signal CEB, the control signal OEB, and an inverted signal of the output signal of the AND gate 38, and outputs an AND signals of these input signals. The NOR gate 37 receives the output signals of the AND gates 35 and 40, and outputs the NOR signals of these output signals to the gate of the PMOS transistor 32.

Compared with the cell drain voltage generator 7A of the first embodiment in FIG. 2, or with the conventional cell drain voltage generator 7 in FIG. 8, the cell drain voltage generator 7B of the second embodiment has a circuit that outputs a cell drain voltage CDV of approx. 0.6 volts or approx. 5.0 volts depending on the logic of the multi-bit addresses MA0, MA1 and MA2 in addition to the write voltage detection signal VPPH and the control signals CEB and OEB.

Figure 6:
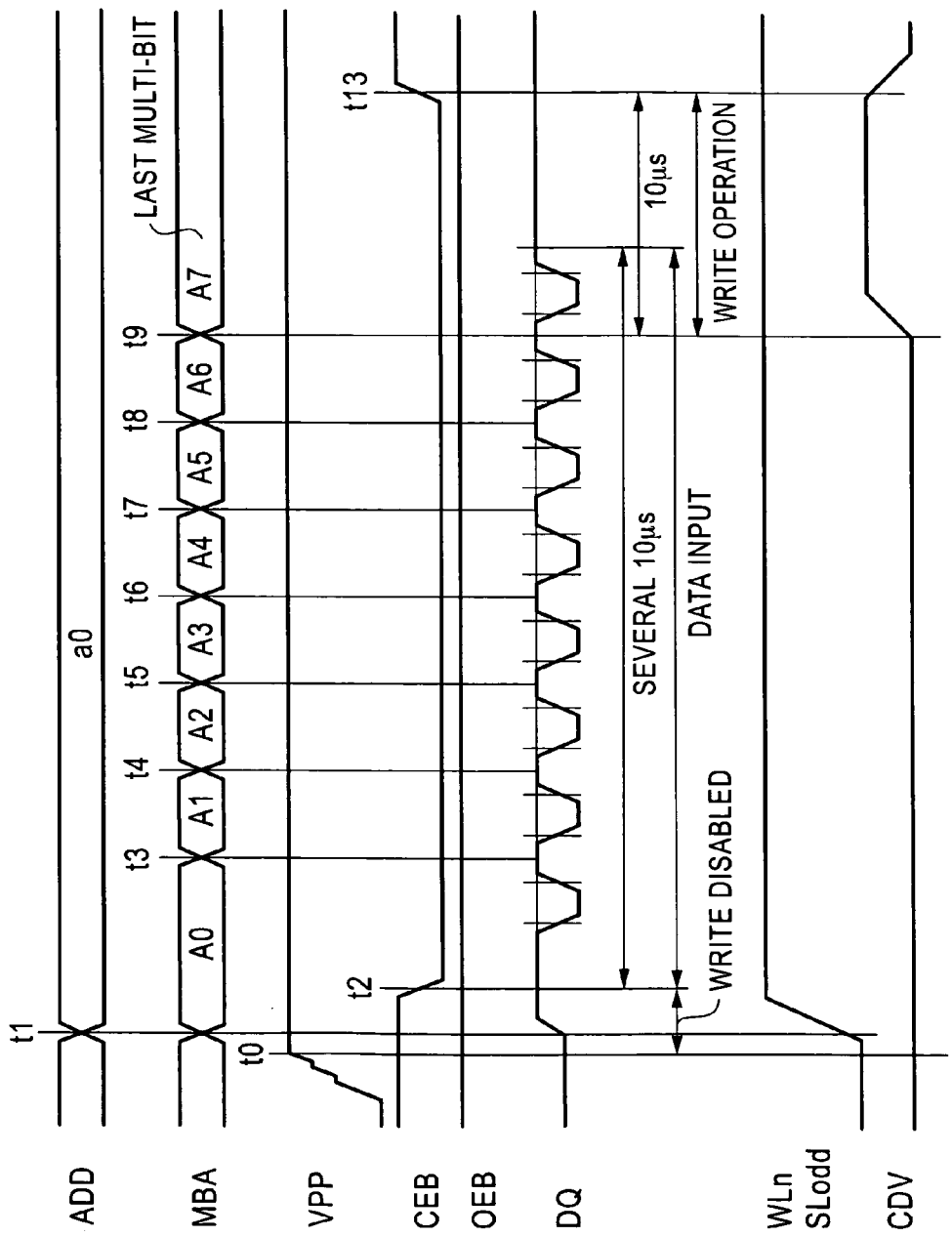
FIG. 6 shows a timing chart of multi-bit writing according to the first embodiment of the present invention.

FIG. 6 shows a timing chart of the multi-bit writing in an EEPROM according to the second embodiment of the present invention, in which the same reference numerals are assigned for the same elements as FIG. 3 or FIG. 9. In the case of the above-described multi-bit writing in the first embodiment, the write operation period is started by changing the logic from VPPH (VPP)/CEB/OEB=H level (high voltage level)/L level/L level to VPPH (VPP)/CEB/OEB=H level (high level voltage/L level/H level after the input and latch of the data DQ-A7 to be written to the multi-bit A7, which is selected last, is completed as shown in FIG. 3. On the other hand, according to the multi-bit writing of the second embodiment, the write operation period starts during the input period of the data DQ-A7 to be written to the multi-bit A7, which is selected last, when the multi-bit address MBA of the multi-bit A7 is input, and the logic changes from VPPH (VPP)/CEB/OEB=H level (high voltage level)/L level/H level and MA0/MA1/MA2=L level/H level/H level to VPPH (VPP)/CEB/OEB=H level (high voltage level)/L level/H level and MA0/MA1/MA2=H level/H level/H level as shown in FIG. 6.

As shown in FIG. 6, before time t0, the write voltage detection signal VPPH (write voltage VPP) and the control signals CEB and OEB are VPPH (VPP)/CEB/OEB=L level (low voltage level)/H level/H level, and in the cell drain voltage generator 7B (see FIG. 5), the outputs of the NAND gate 39 and the NOR gate 37 are both H level, and the PMOS transistors 31 and 32 are both OFF. The row decoder 6 sets all of M word lines WL1 to WLM and two select lines SLodd and SLeven to GND level (0 volt). All the multi-bit decoder & data latch circuits 4-A0 to 4-A7 latch H level as the initial data, and the latch inputs of the multi-bit decoder & data latch circuits 4-A0 to 4-A7 are all disconnected from the input pad 1.

Then at time t0, when the write voltage VPP to be supplied to the row decoder 6 and the cell drain voltage generator 7B from the input pad 15 changes from low voltage (GND level) to high voltage level (approx. 8.0 volts), the write voltage detection signal VPPH changes from L level to H level. Consequently, in the cell drain voltage generator 7B, the output of the AND gate 35 becomes H level and the output of the NOR gate 37 becomes L level, and thus the PMOS transistor 32 turns ON so that a cell drain voltage CDV of approx. 0.6 volts is output from the cell drain voltage generator 7B.

Then at time t1, MA0/MA1/MA2=L level/L level/L level for selecting the multi-bit A0 is input from the input pad 2 as the multi-bit address MBA. Further, according to an example in FIG. 6, the address ADD for selecting the decode address a0 of the word line WLm, the odd select line SLodd and the bit lines BLn-A0 to BLn-A7 is input from the input pad 3.

When the row address among the address ADD for selecting the decode address a0 is input, the row decoder 6 selects the word line WLm from M word lines WL1 to WLM, and selects the odd select line SLodd from two select lines SLodd and SLeven, and applies approx. 8.0 volts from the write voltage VPP to the word line WLm and the odd select line SLodd. Upon this voltage application, all the odd selectors (including odd selectors 8-odd1 and 8-odd2) turn ON so that the cell drain voltage CDV (approx. 0.6 volts in this case) is supplied to all the drain lines (including drain lines DLodd1 and DLodd2) connected to these odd selectors.

When the column address among the address ADD for selecting the decode address a0 is input, the column decoder 5-Ak in charge of the multi-bit Ak selects the bit line BLn-Ak, and connects the output of the multi-bit decoder & data latch circuit 4-Ak in charge of the multi-bit Ak to this bit line BLn-Ak.

When the multi-bit address MBA of MA0/MA1/MA2=L level/L level/L level to select the multi-bit A0 is input, the multi-bit decoder & data latch circuit 4-A0 in charge of multi-bit A0 connects the latch input to the input pad 1.

Further, in the cell drain voltage generator 7B (see FIG. 5), the output of the AND gate 38 is at L level when MA0/MA1/MA2=L level/L level/L level for selecting the first multi-bit A0 is input. Therefore the PMOS transistor 31 remains OFF, and the PMOS transistor 32 remains ON, and even if the multi-bit address MBA for selecting the first multi-bit A0 is input, a cell drain voltage CDV of approx. 0.6 volts, which is the same as that before time t1, is continuously output from the cell drain voltage generator 7B.

Then at time t2, the control signal CEB to be input to the cell drain voltage generator 7B from the input pad 16 changes from H level to L level, and then the write disabled period changes to the data input period.

When the write disabled period changes to the data input period as described above, the logic changes from VPPH (VPP)/CEB/OEB=H level (high voltage level)/H level/H level to VPPH (VPP)/CEB/OEB=H level (high voltage level)/L level/H level. In the case of the cell drain voltage generator 7B (see FIG. 5), the output of the NAND gate 39 remains at H level since the output of the AND gate 38 is at L level. The output of the AND gate 35 changes from H level to L level and the output of the AND gate 40 changes from L level to H level, but the output of the NOR gate 37 remains in L level. Therefore, the PMOS transistor 31 remains OFF and the PMOS transistor 32 remains ON, and thus the cell drain voltage CDV at low voltage level (approx. 0.6 volts), which is the same as that in the write disabled period, is continuously output from the cell drain voltage generator 7B even though the write disabled period changes to the data input period.

As described above, according to the second embodiment, similar to the first embodiment, the cell drain voltage CDV to be output from the cell drain voltage generator 7B remains at low voltage level (approx. 0.6 volts), which is the same as that in the write disabled period, even though the write disabled period changes to the data input period.

In the first embodiment, the cell drain voltage CDV remains at low voltage level (0.6 volts), which is the same as that in the write disabled period, until the end of the data input period (=start of data write period after the completion of the input and latch of the data DQ-A7 to be written to the last multi-bit address A7). On the other hand, in the second embodiment, the cell drain voltage CDV remains at low voltage level (0.6 volts), which is the same as that in the write disabled period, until the end of the input of the multi-bit address MBA for selecting the multi-bit A6 in the data input period (=start of data write period after the completion of the input and latch of data DQ-A6 to be written to the multi-bit address A6), and the write operation period starts before the end of the data input period, upon starting the input of the multi-bit address MBA for selecting the last multi-bit A7 during the data input period.

Therefore according to the second embodiment, no electron is injected into the floating gates of the memory cells, even if the selected bit lines BLn-A0–BLn-A7 become GND level before the start of the input of the multi-bit address MBA for selecting the last multi-bit A7 during the data input period.

As described above, in a similar manner as the multi-bit writing of the first embodiment, the eight data of DQ-A0 to DQ-A7 to be respectively written to the eight multi-bits A0 to A7 are sequentially input from the input pad 1, and these data are latched by the multi-bit decoder & data latch circuits 4-A0 to 4-A7 respectively in the data input period which is partly overlapped by the data write period.

When the data DQ-A0, which is either at H level or L level, to be written to the memory cell of the multi-bit A0 is input from the input pad 1, the multi-bit decoder & data latch circuit 4-A0 in charge of the multi-bit A0, which is being selected at this time, latches the input data DQ-A0 instead of the initial data (H level).

Then, at time t3, when the multi-bit address MBA to be input from the input pad 2 changes from MA0/MA1/MA2=L level/L level/L level for selecting the multi-bit A0 to MA0/MA1/MA2=H level/L level/L level for selecting the multi-bit A1, the multi-bit decoder & data latch circuit 4-A0 in charge of the multi-bit A0 disconnects the latch input from the input pad 1, and the multi-bit decoder & data latch circuit 4-A1 in charge of the multi-bit A1 connects the latch input to the input pad 1.

Then, when the data DQ-A1 to be written to the memory cell of the multi-bit A1 is input from the input pad 1, the multi-bit decoder & data latch circuit 4-A1 in charge of the multi-bit A1, which is being selected at this time, latches the input data DQ-A1 instead of the initial data (H level).

In the cell drain voltage generator 7B (see FIG. 5), the output of the AND gate 38 remains at L level even if the multi-bit address MBA changes from MA0/MA1/MA2=L level/L level/L level for selecting the multi-bit A0 to MA0/MA1/MA2=H level/L level/L level for selecting the multi-bit A1. Therefore the PMOS transistor 31 remains OFF and the PMOS transistor 32 remains ON, and even if the multi-bit address MBA for selecting the multi-bit A1 is input, the cell drain voltage CDV at low voltage level (approx. 0.6 volts), which is the same as that of the write disabled period, is continuously output from the cell drain voltage generator 7B.

In the same way, the multi-bit addresses MBA to be input from the input pad 2 at times t4, t5, t6, t7 and t8 are sequentially changed to MA0/MA1/MA2=H level/L level/L level for selecting the multi-bit A2, MA0/MA1/MA2=H level/H level/L level for selecting the multi-bit A3, MA0/MA1/MA2=L level/L level/H level for selecting the multi-bit A4, MA0/MA1/MA2=H level/L level/H level for selecting the multi-bit A5, and MA0/MA1/MA2=L level/H level/H level for selecting the multi-bit A6, and then the data DQ-A2 to be written to the memory cell of the multi-bit A2, data DQ-A3 to be written to the memory cell of the multi-bit A3, data DQ-A4 to be written to the memory cell of the multi-bit A4, data DQ-A5 to be written to the memory cell of the multi-bit A5 and data DQ-A6 to be written to the memory cell of the multi-bit A6 are sequentially input from the input pad 1, and these input data DQ-A2, DQ-A3, DQ-A4, DQ-A5 and DQ-A6 are sequentially latched by the multi-bit decoder & data latch circuit 4-A2 in charge of the multi-bit A2, the multi-bit decoder & data latch circuit 4-A3 in charge of the multi-bit A3, the multi-bit decoder & data latch circuit 4-A4 in charge of the multi-bit A4, the multi-bit decoder & data latch circuit 4-A5 in charge of the multi-bit A5, and the multi-bit decoder & data latch circuit 4-A6 in charge of the multi-bit A6, respectively.

In the cell drain voltage generator 7B (see FIG. 5), the output of the AND gate 38 remains at L level even if the multi-bit address MBA sequentially changes from MA0/MA1/MA2=L level/L level/L level for selecting the multi-bit A0 to MA0/MA1/MA2=L level/H level/H level for selecting the multi-bit A6. Therefore, the PMOS transistor 31 remains OFF and the PMOS transistor 32 remains ON, and even if the multi-bit address MBA for selecting the multi-bits A0–A6 is input, the cell drain voltage CDV at low voltage level (approx. 0.6 volts), which is the same as that of the write disabled period, is continuously output from the cell drain voltage generator 7B.

Then at time t9, when the multi-bit address MBA to be input from the input pad 2 changes from MA0/MA1/MA2=L level/H level/H level for selecting the multi-bit A6 to MA0/MA1/MA2=H level/H level/H level for selecting the last multi-bit A7, the write operation period starts before the end of the data input period.

As described above, when the multi-bit address MBA changes from MA0/MA1/MA2=L level/L level/L level for selecting the multi-bit A6 to MA0/MA1/MA2=H level/H level/H level for selecting the last multi-bit A7, and the data input period for the multi-bit A7 starts, the multi-bit decoder & data latch circuit 4-A6 in charge of the multi-bit A6 disconnects the latch input from the input pad 1, and the multi-bit decoder & data latch circuit 4-A7 in charge of the multi-bit A7 connects the latch input to the input pad 1.

Then when the data DQ-A7 to be written to the memory cell of the multi-bit A7 is input from the input pad 1, the multi-bit decoder & data latch circuit 4-A7 in charge of the multi-bit A7, which is being selected at this time, latches the input data DQ-A2 instead of the initial data (H level).

As described above, when the multi-bit address MBA changes from MA0/MA1/MA2=L level/L level/L level for selecting the multi-bit A6 to MA0/MA1/MA2=H level/H level/H level for selecting the last multi-bit A7, and the write operation period starts during the data input period for the multi-bit A7, the output of the AND gate 38 changes from L level to H level in the cell drain voltage generator 7B (see FIG. 5) so that the output of the AND gate 40 changes from H level to L level, the output of the NOR gate 37 changes from L level to H level, and the output of the NAND gate 39 changes from H level to L level, which is opposite from the output of the NOR gate 37. Consequently, the PMOS transistor 32 turns OFF and the PMOS transistor 31 turns ON so that the cell drain voltage CDV to be output from the cell drain voltage generator 7B rises from approx. 0.6 volts to approx. 5.0 volts.

When the write operation period starts in which the cell drain voltage CDV rises to approx. 5.0 volts, the input data DQ-A0 to DQ-A6 latched by the multi-bit decoder & data latch circuits 4-A0 to 4-A6 is started to be written to the memory cells of the multi-bits. A0 to A6, respectively, and the data DQ-A7 which is input and latched by the multi-bit decoder & data latch circuit 4-A7 after the start of the write operation period is also latched and started to be written. Then, the data write is completed by holding the write operation for approx. 10 µs from the start of the input of the data DQ-A7.

Then, a cell drain voltage CDV of approx. 5.0 volts for the data writing is simultaneously applied to the drains of the memory cells of the multi-bits A0 to A7, and then at time t13 that is after the holding of write operation for approx. 10 µs, the control signal CEB to be input from the input pad 16 to the cell drain voltage generator 7B changes from L level to H level. Accordingly, the write operation period ends.

As described above, when the logic changes from VPPH (VPP)/CEB/OEB=H level (high voltage level)/L level/H level to VPPH (VPP)/CEB/OEB=H level (high voltage level)/H level/H level and the write operation period ends, the output of the AND gate 39 changes from L level to H level, the output of the AND gate 35 changes from L level to H level, and the output of the NOR gate 37 changes from H level to L level which is opposite from the AND gate 39, in the cell drain voltage generator 7B (see FIG. 5), and thus the PMOS transistor 31 turns OFF and the PMOS transistor 32 turns ON so that the cell drain voltage CDV to be output from the cell drain voltage generator 7B falls from approx. 5.0 volts to approx. 0.6 volts.

The data read operation in the EEPROM of the second embodiment is the same as that in the EEPROM of the first embodiment.

As described above, according to the second embodiment, the logic of the multi-bit addresses MA0, MA1 and MA2 is added to the cell drain voltage generator 7B, and when the data DQ-D7 to be written to the multi-bit A7 selected last is input (when the input period of the last data DQ-D7 starts by the change of the multi-bit address MBA), high cell drain voltage for data writing is applied to the drains of the memory cells. Accordingly, the high cell drain voltage for writing is not applied to the drains of the memory cells during data input, except the last multi-bit A7, even in the case of writing by the ROM writer which requires such a long time of several tens µs to input eight data corresponding to the number of multi-bits, and therefore the high cell drain voltage for writing is not applied for a long time, thereby suppressing the erroneous phenomena of data writing in FIG. 11 which occurs due to stress caused by the long time application of the high cell drain voltage for writing. Accordingly, multi-bit writing can be achieved. By employing the multi-bit write method, the application time of the high cell drain voltage for writing to non-selected memory cell in the non-selected word row decreases to ⅛ (1/the number of multi-bits) as compared with that of the single bit write method, and therefore the data retention phenomena in FIG. 12 which occurs in the non-selected memory cells of the non-selected word row, can be suppressed.

Further, according to the second embodiment, the specifications of multi-bit writing can be the same specifications of the prior art. The time required for multi-bit writing in the second embodiment is shorter than the time required for multi-bit writing in the first embodiment by the data input time of the last multi-bit A7.

According to the above-described embodiments, the write circuit and the write flow of the EPROM was described, but the present invention can be applied to semiconductor devices which need to avoid stress due to unnecessary high voltage for a long time.

This application is based on a Japanese Patent Application No. 2004-247953 which is herein incorporated by reference.

What is claimed is:

1. A data write circuit of a semiconductor storage device having capability of multi-bit writing for writing data to a plurality of memory cells by one write operation comprising:
    data latch means for sequentially latching a plurality of data which are sequentially input in accordance with a change of an input multi-bit address so as to be respectively written to the plurality of memory cells;
    column decode means for respectively applying the plurality of data latched by the data latch means to sources of the plurality of memory cells based on an input column address; and
    cell drain voltage generation means for applying low cell drain voltage with which data write is disabled to drains of the plurality of memory cells until all of the plurality of data is latched, and for simultaneously applying high cell drain voltage for writing data to the drains of the plurality of memory cells when all of the plurality of data are latched and are applied to the sources of the plurality of memory cells so as to respectively write the plurality of data to the plurality of memory cells.

2. The data write circuit according to claim 1, wherein the cell drain voltage generation means sets timing to apply the high cell drain voltage based on logic of two input control signals.

3. The data write circuit according to claim 1, wherein the semiconductor storage device is an EEPROM.

4. A data write circuit of a semiconductor storage device having capability of multi-bit writing for writing data to a plurality of memory cells by one write operation comprising:
    data latch means for sequentially latching a plurality of data which are sequentially input in accordance with a change of an input multi-bit address so as to be respectively written to the plurality of memory cells;

column decode means for respectively applying the plurality of data latched by the data latch means to sources of the plurality of memory cells based on an input column address; and cell drain voltage generation means for applying low cell drain voltage with which data write is disabled to drains of the plurality of memory cells until an input period of last data of the plurality of data starts by a change of the multi-bit address, and for simultaneously applying high cell drain voltage for writing data to the drains of the plurality of memory cells when the input period of the last data starts so as to respectively write the plurality of data to the plurality of memory cells.

5. The data write circuit according to claim 4, wherein the cell drain voltage generation means sets timing to apply the high cell drain voltage based on logic of one input control signal and the input multi-bit address.

6. The data write circuit according to claim 4, wherein the semiconductor storage device is an EEPROM.

7. A data write method for a semiconductor storage device having capability of multi-bit writing for writing data to a plurality of memory cells by one write operation comprising:

applying low cell drain voltage with which data write is disabled to drains of the plurality of memory cells;

respectively connecting a plurality of latch outputs of data latch means to sources of the plurality of memory cells based on an input column address;

sequentially latching a plurality of data which are sequentially input in accordance with a change of an input multi-bit address by the data latch means so as to be respectively written to the plurality of memory cells; and simultaneously applying high cell drain voltage for writing data to drains of the plurality of memory cells when all of the plurality of data are latched and applied to the sources of the plurality of memory cells so as to respectively write the plurality of data to the plurality of memory cells.

8. The data write method according to claim 7, wherein the semiconductor storage device is an EEPROM.

9. A data write method for a semiconductor storage device having capability of multi-bit writing for writing data to a plurality of memory cells by one write operation comprising:

applying low cell drain voltage with which data write is disabled to drains of the plurality of memory cells;

respectively connecting a plurality of latch outputs of data latch means to sources of the plurality of memory cells based on an input column address;

sequentially latching a plurality of data which are sequentially input in accordance with a change of an input multi-bit address by the data latch means so as to be respectively written to the plurality of memory cells; and simultaneously applying high cell drain voltage for writing data to drains of the plurality of memory cells when the input period of the last data among the plurality of data is started by a change of the multi-bit address so as to respectively write the plurality of data to the plurality of memory cells.

10. The data write method according to claim 9, wherein the semiconductor storage device is an EEPROM.

11. A data write circuit of a semiconductor storage device having capability of multi-bit writing for writing data to a plurality of memory cells by one write operation comprising:

a multi-bit decoder and data latch circuit for sequentially latching a plurality of data which are sequentially input in accordance with a change of an input multi-bit address so as to be respectively written to the plurality of memory cells;

a column decoder for respectively applying the plurality of data latched by the multi-bit decoder and data latch circuit to sources of the plurality of memory cells based on an input column address; and a cell drain voltage generator for applying low cell drain voltage with which data write is disabled to drains of the plurality of memory cells until all of the plurality of data is latched, and for simultaneously applying high cell drain voltage for writing data to the drains of the plurality of memory cells when all of the plurality of data are latched and are applied to the sources of the plurality of memory cells so as to respectively write the plurality of data to the plurality of memory cells.

12. The data write circuit according to claim 7, wherein the cell drain voltage generator sets timing to apply the high cell drain voltage based on logic of two input control signals.

13. The data write circuit according to claim 11, wherein the semiconductor storage device is an EEPROM.

14. A data write circuit of a semiconductor storage device having capability of multi-bit writing for writing data to a plurality of memory cells by one write operation comprising:

a multi-bit decoder and data latch circuit for sequentially latching a plurality of data which are sequentially input in accordance with a change of an input multi-bit address so as to be respectively written to the plurality of memory cells;

a column decoder for respectively applying the plurality of data latched by the multi-bit decoder and data latch circuit to sources of the plurality of memory cells based on an input column address; and a cell drain voltage generator for applying low cell drain voltage with which data write is disabled to drains of the plurality of memory cells until an input period of last data of the plurality of data starts by a change of the multi-bit address, and for simultaneously applying high cell drain voltage for writing data to the drains of the plurality of memory cells when the input period of the last data starts so as to respectively write the plurality of data to the plurality of memory cells.

15. The data write circuit according to claim 14, wherein the cell drain voltage generator sets timing to apply the high cell drain voltage based on logic of one input control signal and the input multi-bit address.

16. The data write circuit according to claim 14, wherein the semiconductor storage device is an EEPROM.

* * * * *